(12) United States Patent
O'Donnell et al.

(10) Patent No.: US 9,461,229 B2
(45) Date of Patent: Oct. 4, 2016

(54) SYSTEMS AND METHODS FOR SELECTIVELY PRODUCING STEAM FROM SOLAR COLLECTORS AND HEATERS FOR PROCESSES INCLUDING ENHANCED OIL RECOVERY

(71) Applicant: GLASSPOINT SOLAR, INC., Fremont, CA (US)

(72) Inventors: John Setel O'Donnell, Palo Alto, CA (US); Peter Emery von Behrens, San Francisco, CA (US); Andras Nady, Berkeley, CA (US); Stuart M. Heisler, Bakersfield, CA (US)

(73) Assignee: GlassPoint Solar, Inc., Fremont, CA (US)

(*) Notice: Subject to any disclaimer, the term of this patent is extended or adjusted under 35 U.S.C. 154(b) by 0 days.

(21) Appl. No.: 14/747,998

(22) Filed: Jun. 23, 2015

(65) Prior Publication Data

US 2015/0295158 A1 Oct. 15, 2015

Related U.S. Application Data

(63) Continuation of application No. 14/147,428, filed on Jan. 3, 2014, now Pat. No. 9,200,799.

(60) Provisional application No. 61/829,984, filed on May 31, 2013, provisional application No. 61/749,888, filed on Jan. 7, 2013.

(51) Int. Cl.
*E21B 43/24* (2006.01)
*H01L 35/30* (2006.01)
(Continued)

(52) U.S. Cl.
CPC ............ *H01L 35/30* (2013.01); *E21B 43/24* (2013.01); *F01K 3/14* (2013.01); *F01K 3/242* (2013.01);
(Continued)

(58) Field of Classification Search
CPC ........ E21B 43/24; E21B 43/40; E21B 43/25; F24J 3/00; F24J 2/42; F24J 2/30; F24J 2/34; F24J 2/46; F03G 6/00; F22B 29/00; F22B 1/006; F22B 1/00; F22B 3/00; F22B 1/18; F01K 3/14; F01K 3/242; F01K 13/02; H01L 35/30; Y02E 10/40
See application file for complete search history.

(56) References Cited

U.S. PATENT DOCUMENTS 1,240,890 A 9/1917 Shuman et al.
2,217,593 A 10/1940 London
(Continued)

FOREIGN PATENT DOCUMENTS

CN 2050918 U 1/1990
CN 2926930 Y 7/2007
(Continued)

OTHER PUBLICATIONS

U.S. Appl. No. 14/267,643, filed May 1, 2014, titled Concentrating Solar Power With Glasshouses.
(Continued)

*Primary Examiner* — Yong-Suk (Philip) Ro
(74) *Attorney, Agent, or Firm* — Perkins Coie LLP

(57) ABSTRACT

Systems and methods for selectively producing steam from solar collectors and heaters, for processes including enhanced oil recovery. A system in accordance with a particular embodiment includes a water source, a solar collector that includes a collector inlet, a collector outlet, and a plurality of solar concentrators positioned to heat water passing from the collector inlet to the collector outlet, a fuel-fired heater, a steam outlet connected to an oil field injection well, and a water flow network coupled among the water source, the solar collector, the heater, and the steam outlet. The system can further include a controller operatively coupled to the water flow network and programmed with instructions that, when executed, direct at least one portion of the flow through the solar collector and the fuel-fired heater in a first sequence, and direct the at least one portion or a different portion of the flow through the solar collector and the fuel-fired heater in a second sequence different than the first sequence.

10 Claims, 17 Drawing Sheets

(51) Int. Cl.

| | | |
|---|---|---|
| *F22B 1/00* | (2006.01) | |
| *F24J 2/42* | (2006.01) | |
| *F01K 3/14* | (2006.01) | |
| *F01K 3/24* | (2006.01) | |
| *F01K 13/02* | (2006.01) | |
| *F22B 1/18* | (2006.01) | |
| *G05B 15/02* | (2006.01) | |
| *F24J 2/30* | (2006.01) | |
| *F24J 2/34* | (2006.01) | |
| *F24J 2/46* | (2006.01) | |

(52) U.S. Cl.
CPC .............. *F01K 13/02* (2013.01); *F22B 1/006* (2013.01); *F22B 1/18* (2013.01); *F24J 2/30* (2013.01); *F24J 2/34* (2013.01); *F24J 2/42* (2013.01); *F24J 2/46* (2013.01); *G05B 15/02* (2013.01); *Y02E 10/40* (2013.01)

(56) References Cited

U.S. PATENT DOCUMENTS

| | | |
|---|---|---|
| 2,221,919 A | 11/1940 | Kenan |
| 2,859,745 A | 11/1958 | Von Brudersdorff |
| 3,672,572 A | 6/1972 | Delfs |
| 3,847,136 A | 11/1974 | Salvail |
| 3,923,039 A | 12/1975 | Falbel |
| 3,962,873 A | 6/1976 | Davis |
| 3,991,740 A | 11/1976 | Rabl |
| 3,994,279 A | 11/1976 | Barak |
| 3,996,917 A | 12/1976 | Trihey |
| 4,003,366 A | 1/1977 | Lightfoot |
| 4,015,585 A | 4/1977 | Fattor |
| 4,078,549 A | 3/1978 | McKeen et al. |
| 4,083,155 A | 4/1978 | Lampert |
| 4,088,116 A | 5/1978 | Pastor |
| 4,095,369 A | 6/1978 | Posnansky et al. |
| 4,108,154 A | 8/1978 | Nelson |
| 4,122,832 A | 10/1978 | Hirschsohn et al. |
| 4,124,277 A | 11/1978 | Stang |
| 4,149,523 A | 4/1979 | Boy-Marcotte et al. |
| 4,159,712 A | 7/1979 | Legg |
| 4,174,752 A | 11/1979 | Slater et al. |
| 4,184,482 A | 1/1980 | Cohen |
| 4,202,322 A | 5/1980 | Delgado et al. |
| 4,209,222 A | 6/1980 | Posnansky |
| 4,219,008 A | 8/1980 | Schultz |
| RE30,407 E | 9/1980 | Lightfoot |
| 4,230,095 A | 10/1980 | Winston |
| 4,237,864 A | 12/1980 | Kravitz |
| 4,249,340 A | 2/1981 | Maes, Jr. |
| 4,258,696 A | 3/1981 | Gopal |
| 4,263,893 A | 4/1981 | Pavlak et al. |
| 4,280,480 A | 7/1981 | Raposo |
| 4,282,394 A | 8/1981 | Lackey et al. |
| 4,287,880 A | 9/1981 | Geppert |
| 4,290,419 A | 9/1981 | Rabedeaux |
| 4,314,604 A | 2/1982 | Koller |
| 4,318,394 A | 3/1982 | Alexander |
| 4,333,447 A | 6/1982 | Lemrow et al. |
| 4,343,533 A | 8/1982 | Currin et al. |
| 4,371,623 A | 2/1983 | Taylor |
| 4,372,386 A | 2/1983 | Rhoades et al. |
| 4,386,600 A | 6/1983 | Eggert, Jr. |
| 4,410,156 A | 10/1983 | Pischzik et al. |
| 4,423,719 A | 1/1984 | Hutchison |
| 4,445,499 A | 5/1984 | Platell |
| 4,462,390 A | 7/1984 | Holdridge et al. |
| 4,484,568 A | 11/1984 | Witt |
| 4,490,926 A | 1/1985 | Stokes et al. |
| 4,597,377 A | 7/1986 | Melamed |
| 4,628,142 A | 12/1986 | Hashizume |
| 4,727,854 A | 3/1988 | Johnson |
| 4,741,161 A | 5/1988 | Belart et al. |
| 5,048,507 A | 9/1991 | Ridett |
| 5,103,524 A | 4/1992 | Vowles |
| 5,191,876 A | 3/1993 | Atchley |
| 5,258,101 A | 11/1993 | Breu |
| 5,344,496 A | 9/1994 | Stern et al. |
| 5,347,402 A | 9/1994 | Arbogast |
| 5,520,747 A | 5/1996 | Marks |
| 5,524,610 A | 6/1996 | Clark |
| 5,699,785 A | 12/1997 | Sparkman |
| 5,851,309 A | 12/1998 | Kousa |
| 5,954,046 A | 9/1999 | Wegler |
| 6,017,002 A | 1/2000 | Burke et al. |
| 6,129,844 A | 10/2000 | Dobelmann |
| 6,220,339 B1 | 4/2001 | Krecke |
| 6,233,914 B1 | 5/2001 | Fisher |
| 6,294,723 B2 | 9/2001 | Uematsu et al. |
| 6,363,928 B1 | 4/2002 | Anderson, Jr. |
| 6,485,152 B2 | 11/2002 | Wood |
| 6,508,850 B1 | 1/2003 | Kotliar |
| 7,028,685 B1 | 4/2006 | Krecke |
| 7,055,519 B2 | 6/2006 | Litwin |
| 7,337,843 B2 | 3/2008 | Mecham et al. |
| 7,748,137 B2 | 7/2010 | Wang |
| 7,858,875 B2 | 12/2010 | Lu |
| 7,975,686 B2 | 7/2011 | Prueitt |
| 7,992,553 B2 | 8/2011 | Le Lievre |
| 8,056,555 B2 | 11/2011 | Prueitt |
| 8,167,041 B2 | 5/2012 | Chiesa et al. |
| 8,333,186 B2 | 12/2012 | Jennings |
| 8,342,169 B2 | 1/2013 | Glynn |
| 8,397,434 B2 | 3/2013 | Bayne |
| 8,430,090 B2 | 4/2013 | Angel et al. |
| 8,604,333 B2 | 12/2013 | Angel et al. |
| 8,701,773 B2 | 4/2014 | O'Donnell et al. |
| 8,739,774 B2 | 6/2014 | O'Donnell et al. |
| 8,748,731 B2 | 6/2014 | MacGregor et al. |
| 8,752,542 B2 | 6/2014 | O'Donnell et al. |
| 8,887,712 B2 | 11/2014 | von Behrens |
| 8,915,244 B2 | 12/2014 | von Behrens |
| 2001/0008144 A1 | 7/2001 | Uematsu et al. |
| 2003/0080604 A1 | 5/2003 | Vinegar et al. |
| 2003/0188477 A1 | 10/2003 | Pasternak et al. |
| 2004/0004303 A1 | 1/2004 | Iskra |
| 2004/0055594 A1 | 3/2004 | Hochberg et al. |
| 2006/0048770 A1 | 3/2006 | Meksvanh et al. |
| 2007/0056726 A1 | 3/2007 | Shurtleff |
| 2008/0066736 A1 | 3/2008 | Zhu |
| 2008/0083405 A1 | 4/2008 | Kimura et al. |
| 2008/0163864 A1 | 7/2008 | Larson |
| 2008/0216822 A1 | 9/2008 | Lazzara et al. |
| 2008/0236227 A1 | 10/2008 | Flynn |
| 2008/0308094 A1 | 12/2008 | Johnston |
| 2009/0056698 A1 | 3/2009 | Johnson et al. |
| 2009/0056699 A1 | 3/2009 | Mills et al. |
| 2009/0056704 A1 | 3/2009 | Donati et al. |
| 2009/0056944 A1 | 3/2009 | Nitschke |
| 2009/0199847 A1 | 8/2009 | Hawley |
| 2009/0260359 A1 | 10/2009 | Palkes |
| 2009/0277224 A1 | 11/2009 | Angel et al. |
| 2009/0277440 A1 | 11/2009 | Angel et al. |
| 2009/0320830 A1 | 12/2009 | Bennett |
| 2010/0051016 A1 | 3/2010 | Ammar |
| 2010/0051021 A1 | 3/2010 | Kunz |
| 2010/0175687 A1 | 7/2010 | Zillmer et al. |
| 2010/0300431 A1 | 12/2010 | Carrascosa Perez et al. |
| 2011/0017274 A1 | 1/2011 | Huang et al. |
| 2011/0088686 A1 | 4/2011 | Hochberg et al. |
| 2011/0126824 A1 | 6/2011 | Conlon et al. |
| 2011/0174935 A1 | 7/2011 | Bingham et al. |
| 2011/0203574 A1 | 8/2011 | Harding |
| 2011/0203577 A1 | 8/2011 | Coduri |
| 2011/0240006 A1 | 10/2011 | Linke et al. |
| 2011/0277470 A1 | 11/2011 | Benyaminy et al. |
| 2011/0291405 A1 | 12/2011 | Burger et al. |
| 2012/0067337 A1 | 3/2012 | Hall et al. |
| 2012/0125400 A1 | 5/2012 | Angel et al. |
| 2012/0125611 A1 | 5/2012 | Ayirala et al. |
| 2012/0138293 A1 | 6/2012 | Kaminsky et al. |
| 2012/0138316 A1 | 6/2012 | Matzakos |
| 2012/0152307 A1 | 6/2012 | Macgregor et al. |

(56) References Cited

U.S. PATENT DOCUMENTS

| | | | |
|---|---|---|---|
| 2012/0167873 A1 | 7/2012 | Venetos et al. | |
| 2012/0234311 A1 | 9/2012 | Johnson et al. | |
| 2012/0255309 A1 | 10/2012 | Venetos et al. | |
| 2013/0092153 A1* | 4/2013 | O'Donnell | F24J 2/54 126/600 |
| 2013/0206134 A1 | 8/2013 | O'Donnell et al. | |
| 2013/0220305 A1 | 8/2013 | von Behrens | |
| 2014/0069416 A1 | 3/2014 | von Behrens | |
| 2014/0190469 A1 | 7/2014 | O'Donnell et al. | |
| 2014/0216717 A1 | 8/2014 | O'Donnell et al. | |
| 2014/0326234 A1 | 11/2014 | O'Donnell et al. | |
| 2014/0345599 A1 | 11/2014 | O'Donnell et al. | |
| 2014/0347757 A1 | 11/2014 | MacGregor et al. | |
| 2015/0144125 A1 | 5/2015 | von Behrens | |

FOREIGN PATENT DOCUMENTS

| | | |
|---|---|---|
| CN | 200958464 Y | 10/2007 |
| CN | 201059795 Y | 5/2008 |
| CN | 101270675 A | 9/2008 |
| CN | 101280966 A | 10/2008 |
| CN | 101354191 A | 1/2009 |
| CN | 101363958 A | 2/2009 |
| CN | 201359397 Y | 12/2009 |
| DE | 102004013590 A1 | 10/2005 |
| DE | 202005021000 U1 | 1/2007 |
| EP | 0506568 A1 | 9/1992 |
| EP | 0946432 B1 | 1/2001 |
| EP | 988493 B1 | 8/2003 |
| FR | 2696753 A1 | 4/1994 |
| JP | 56085508 | 7/1981 |
| JP | 2001082104 | 3/2001 |
| KR | 20080024309 A | 3/2008 |
| WO | WO-2007146183 A2 | 12/2007 |
| WO | 2009002772 A2 | 12/2008 |
| WO | WO-2008153922 A1 | 12/2008 |
| WO | WO-2009126875 A2 | 10/2009 |
| WO | WO-2010032095 A2 | 3/2010 |
| WO | 2010043744 A2 | 4/2010 |
| WO | WO-2010040957 A2 | 4/2010 |
| WO | WO-2010088632 A2 | 8/2010 |
| WO | WO-2011053863 A2 | 5/2011 |
| WO | WO-2012006255 A2 | 1/2012 |
| WO | WO-2012006257 A2 | 1/2012 |
| WO | WO-2012006258 A2 | 1/2012 |
| WO | WO-2012128877 A2 | 9/2012 |

OTHER PUBLICATIONS

U.S. Appl. No. 13/861,196, filed Apr. 11, 2013, titled Concentrating Solar Power With Glasshouses.

U.S. Appl. No. 14/549,684, filed Nov. 21, 2014, titled Concentrating Solar Power With Glasshouses.

U.S. Appl. No. 14/243,115, filed Apr. 2, 2014, titled Direct Solar Steam Generation.

U.S. Appl. No. 13/730,249, filed Dec. 28, 2012, titled Subsurface Thermal Energy Storage of Heat Generated by Concentrating Solar Power.

U.S. Appl. No. 13/916,958, filed Jun. 13, 2013, titled Oilfield Application of Solar Energy Collection.

U.S. Appl. No. 13/916,983, filed Jun. 13, 2013, titled Oilfield Application of Solar Energy Collection.

U.S. Appl. No. 13/917,018, filed Jun. 13, 2013, titled Oilfield Application of Solar Energy Collection.

U.S. Appl. No. 14/194,919, filed Mar. 3, 2014, titled Oilfield Application of Solar Energy Collection.

U.S. Appl. No. 13/957,223, filed Aug. 1, 2013, titled Concentrating Solar Power With Glasshouses.

U.S. Appl. No. 14/147,428, filed Jan. 3, 2014, titled Systems and Methos for Selectively Producing Steam From Solar Collectors and Heaters for Processes Including Enhanced Oil Recovery.

U.S. Appl. No. 14/148,647, filed Jan. 6, 2014, titled Systems and Methods for Selectively Producing Steam From Solar Collectors and Heaters.

U.S. Appl. No. 14/745,227, filed Jun. 19, 2015, titled Systems and Methods for Selectively Producing Steam From Solar Collectors and Heaters for Processes Including Enhanced Oil Recovery.

U.S. Appl. No. 14/745,162, filed Jun. 19, 2015, titled Systems and Methods for Selectively Producing Steam From Solar Collectors and Heaters for Processes Including Enhanced Oil Recovery.

Adventures in Energy, "Extracting Oil and Natural Gas." 1 pages, accessed Oct. 7, 2013.

Adventures in Energy, "Separating Oil, Natural Gas and Water." 1 page, accessed Oct. 7, 2013.

Bierman et al "Performance of Enclosed Trough OTSG for Enhanced Oil Recovery," SolarPaces 2013, pp. 11.

Bierman et al "Solar Enhanced Oil Recovery Plant in South Oman," SolarPaces 2013; pp. 10.

BrightSource Limitless, "Coalinga Project Facts, A BrightSource Energy Concentrating Solar Power Project," Fact Sheet, accessed Sep. 19, 2013, http://www.brightsourceenergy.com/stuff/contentmgr/files/0/ad5d33a2bc493a5079b5dda609724238/folder/coalinga_fact_sheet.pdf, 2 pages.

BrightSource Limitless, "Enhanced Oil Recovery Project—Coalinga," accessed Sep. 19, 2013, http://www.brightsourceenergy.com/coalinga, 2 pages.

Champion Technologies, "Enhanced Oil Recovery." 2 pages, accessed Oct. 7, 2013.

International Search Report and Written Opinion issued in PCT/US2014/010389, mailed May 28, 2014, 13 pages.

PROZ, 'on the edge of manufacturing tolerance' [bulletin board], Mar. 12, 2005 [retrieved on Jan. 7, 2014]. Retrieved from the internet <http://www.proz.com/kudoz/English/military_defense/968330-on_the_edge_of_manufacturing_tolerance.html>.

The Linde Group, "Enhanced Oil Recovery (EOR)", 1 page, accessed Oct. 7, 2013.

Wilson, Bob. "Re: Why does a bridge have rollers under it? How do the rollers of a bridge work?", Newton Ask a Scientist! (DOE Office of Science) [online], Jan. 2, 2008 [retrieved from the internet <URL:http://web.archive.org/web/20080102111713/http://www.newton.dep.anl.gov/askasci/eng99/eng99556.htm>.

* cited by examiner

US 9,461,229 B2

SYSTEMS AND METHODS FOR SELECTIVELY PRODUCING STEAM FROM SOLAR COLLECTORS AND HEATERS FOR PROCESSES INCLUDING ENHANCED OIL RECOVERY

CROSS-REFERENCE TO RELATED APPLICATIONS

The present application is a continuation of U.S. Non-Provisional application Ser. No. 14/147,428, filed Jan. 3, 2014, which claims priority to U.S. Provisional Application No. 61/749,888, filed Jan. 7, 2013, and U.S. Provisional Application No. 61/829,984, filed May 31, 2013, both of which are incorporated herein by reference. To the extent the foregoing applications and/or any other materials incorporated herein by reference conflict with the present disclosure, the present disclosure controls.

TECHNICAL FIELD

The present technology is directed generally to systems and methods for selectively producing steam from solar collectors and heaters, including techniques for increasing the steam production efficiency for enhanced oil recovery processes by varying the energy contributions from each of the foregoing components.

BACKGROUND

As fossil fuels become more scarce, the energy industry has developed more sophisticated techniques for extracting fuels that were previously too difficult or expensive to extract. One such technique is to inject steam into an oil-bearing formation to free up and reduce the viscosity of the oil. Several techniques for steam injection presently exist, and are often collectively referred to as "Thermal Enhanced Oil Recovery," or "Thermal EOR." Representative steam injection techniques include cyclic, steamflood, steam-assisted gravity drainage (SAGD), and other strategies using vertical and/or horizontal injection wells, or a combination of such wells, along with continuous, variable-rate, and/or intermittent steam injection in each well.

One representative system for forming steam for steam injection is a fuel-fired boiler, having a once-through configuration or a recirculating configuration. Other steam generating systems include heat recovery steam generators, operating in a continuous mode. Thermal EOR operations often produce steam 24 hours per day, over a period ranging from many days to many years. During the period of continuous steam injection, steam pressures and flow rates may be roughly constant in some cases, may vary within a predetermined limited range in other cases, or may vary more widely according to a predetermined plan. However, it is generally undesirable to shut down and start the steam generating equipment (e.g., on a daily basis) because such cycles increase equipment maintenance associated with thermal cycling, and the potential for increased corrosion during idle or standby periods.

Another representative steam generator is a solar steam generator, which can augment or replace the fuel-fired boilers. Solar steam generators can reduce fuel use, reduce operations costs, reduce air emissions, and/or increase oil production in thermal recovery projects. However, such systems collect energy intermittently due to day/night patterns of available solar radiation, with energy production rates varying according to factors which include the variation of incoming solar radiation. Due to the above-described demand for continuous steam, many or most thermal recovery projects which incorporate solar steam generators will also incorporate one or more fuel-fired steam generators, which combust liquid or gaseous fuels as a supplemental source of heat to form steam from an incoming liquid water stream. However, such combinations of solar and fuel-fired boilers are typically inefficient, e.g., because they include many additional components, waste energy, and/or have excess or redundant capacity. Accordingly, there remains a need for high-efficiency solar steam generation systems.

DETAILED DESCRIPTION

Figure 1:
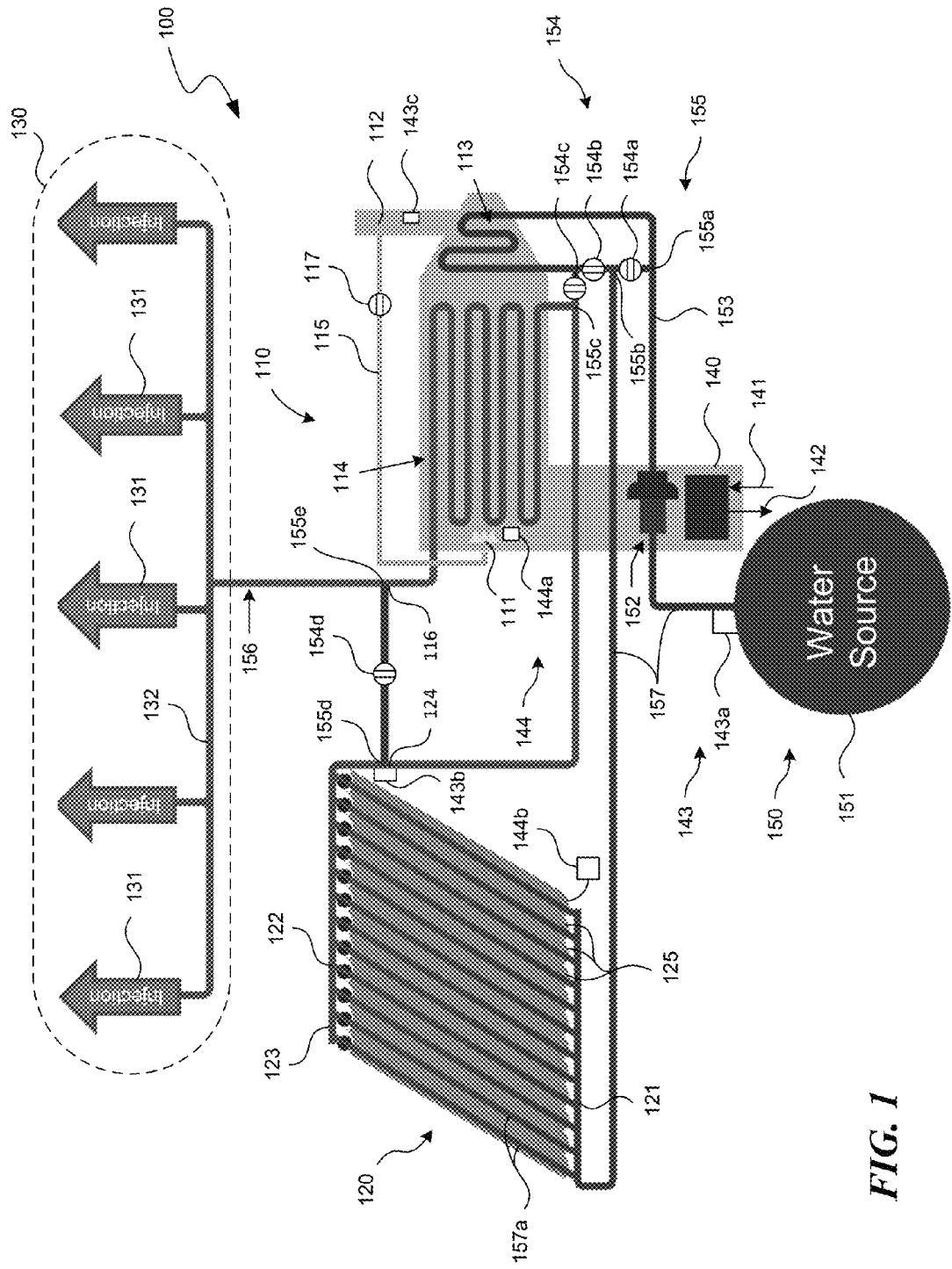
FIG. 1 is a partially schematic illustration of a system that includes a solar collector, a heater, and a controller configured in accordance with an embodiment of the presently disclosed technology.

The present technology is directed generally to systems and methods for selectively producing steam from solar collectors and one or more additional heaters (e.g., auxiliary, complementary and/or supplementary heaters). Specific details of several embodiments of the disclosed technology are described below with reference to a system configured for oil well steam injection to provide a thorough understanding of these embodiments, but in other embodiments, representative systems can be used in other contexts. Several details describing structures or processes that are well-known and often associated with steam generation systems, but that may unnecessarily obscure some significant aspects of the present technology, are not set forth in the following description for purposes of clarity. Moreover, although the following disclosure sets forth several embodiments of different aspects of the presently disclosed technology, several other embodiments of the technology can have configurations and/or components different than those described in this section. Accordingly, the presently disclosed technology may have other embodiments with additional elements, and/or without several of the elements described below with reference to FIGS. 1-8C.

Many embodiments of the presently disclosed technology described below may take the form of computer-executable instructions, including routines executed by a programmable computer. Those skilled in the relevant art will appreciate that the technology can be practiced on or by computer systems and/or controllers other than those shown and described below. The technology can be embodied in a special-purpose computer or data processor that is specifically programmed, configured and/or constructed to perform one or more of these computer-executable instructions described below. Accordingly, the terms "computer" and "controller" as generally used herein refer to any suitable data processor and can include internet appliances and hand-held devices (including palm-top computers, wearable computers, cellular or mobile phones, multi-processor systems, processor-based or programmable consumer electronics, network computers, minicomputers and the like).

The present technology can also be practiced in distributed environments, where tasks or modules are performed by remote processing devices that are linked through a communications network. In a distributed computing environment, program modules or subroutines may be located in local and remote memory storage devices. Aspects of the technology described below may be stored or distributed on computer-readable media, including magnetic or optically readable or removable computer disks, as well as distributed electronically over networks. In particular embodiments, data structures and transmissions of data particular to aspects of the technology are also encompassed within the scope of the present technology.

Embodiments of the technology described below include systems that generate steam, techniques for manufacturing, assembling, programming, operating and/or controlling such systems, and methods for instructing the use, construction, development, and/or other aspects of the system. Accordingly, various embodiments of the presently disclosed technology may include taking direct action (e.g., by a person, machine, controller, software or hardware) and/or instructing (by a person, machine, controller, software or hardware) tasks to be completed by human or non-human entities.

FIG. 1 is a partially schematic illustration of an overall system 100 used to generate steam. The system 100 includes one or more solar collectors 120 operatively coupled to one or more heaters 110 (one is shown in FIG. 1 for purposes of illustration) to deliver steam to a target 130 under the direction of a controller 140. The heater 110 can supplement the energy provided by the solar collector 120 so as to provide to the target 130 a relatively constant flow of steam having a relatively constant quality and/or other characteristics. In other embodiments, the solar collector 120 and the heater 110 can operate together to produce steam in varying amounts and/or with varying characteristics. In any of these embodiments, features of the foregoing components are deliberately configured and controlled to increase the overall efficiency and/or reduce the cost of the system 100 when compared with conventional steam generation systems, as will be described in further detail below.

Embodiments of the system 100 shown in FIG. 1 include a water flow system 150 that provides liquid water to the solar collector 120 and the heater 110, which in turn generate steam that is provided to the target 130. In a particular embodiment, the target 130 includes a manifold 132 coupled to one or more injection wells 131 used to extract oil in a thermal enhanced oil recovery or thermal EOR process. In other embodiments, the target 130 can be any of a number of suitable systems and/or processes that use steam as an input, e.g., a thermoelectric generator 131 as described later with reference to FIG. 4. When the target 130 is an oilfield, the system 100 can, in particular embodiments, include multiple combinations of solar collectors 120 and heaters 110, interconnected to a common stream distribution network and a common set of injection wells 131.

The water flow system 150 can include a water source 151 (e.g., a well, tank, reservoir, and/or combination of the foregoing elements) coupled to a network of appropriately insulated conduits 157. In general, the conduits are insulated where thermal losses are otherwise expected to be significant, e.g., downstream of the solar collector 120 and/or the heater 110. Internal elements of the heater 110 can also be insulated. At least some elements of the solar collector 120 may not be insulated, so as not to interfere with the ability of the solar collector 120 to receive and collect solar radiation, as will be discussed in greater detail later. The water source 151 delivers liquid water to an inlet device 152 (e.g., a positive displacement pump, a multi-stage turbo-pump, or another pump, valve, or controllable device) that in turn provides the water to an inlet conduit 153. The inlet conduit 153 provides liquid water to both the solar collector 120 and the heater 110. The solar collector 120 collects incident radiation from the sun, while the heater 110 generates heat from terrestrial fuel sources.

In particular embodiments, the heater 110 is an appropriately insulated gas or other fuel-fired (e.g., fossil fuel-fired) heater that includes one or more combustion burners 111 (shown schematically as single burner 111 for purposes of illustration) and directs heated combustion products over multiple heater portions. In a representative embodiment, the heater 110 includes a first heater portion 113 and a second heater portion 114. The first heater portion 113 can operate as a preheater and/or economizer, and the second heater portion 114 can operate as an evaporator, radiant heater, and/or superheater. Accordingly, the burner 111 directs hot combustion gases along an exhaust gas path first through the second heater portion 114, then through the first heater portion 113, and then to a burner exhaust 112 (e.g., an exhaust stack). As a result, the second heater portion 114 receives the highest temperature heater gases, and the first heater portion 113 receives lower temperature heater gases. Heated water (e.g. steam) exits the heater 110 at a heater outlet 116. An exhaust gas recirculation conduit 115 can recirculate exhaust gas from the burner exhaust 112 back to the burner 111 and/or other heater elements to improve the efficiency of the heater 110 by recapturing heat that would otherwise be lost to the environment. A recirculation valve 117 controls whether and to what degree the exhaust gases are recirculated. In particular embodiments, exhaust gas recirculation is used to reduce the oxygen fraction in the combustion gas and thus slow combustion, lower peak flame temperature, and reduce the formation of oxides of nitrogen ($NO_x$), and/or gaseous pollutants. In further aspects of these embodiments, exhaust gas recirculation plays a role in maintaining adequate gas flow to maintain effective heat transfer to the heat transfer tubes within the heater 110 (e.g., to maintain high heat transfer turbulent flow), and thus allow the burner 111 to be more readily turned down. As is discussed in further detail later, turning the burner 111 down facilitates improving and/or optimizing the heat contributions provided by the solar collector 120 and the heater 110.

The solar collector 120 can include a collector inlet manifold 121 (optional) and a collector outlet manifold 122 (also optional). The collector inlet manifold 121 distributes incoming water through collection conduits 157a (and/or other suitable solar receivers) that receive concentrated solar energy from one or more corresponding solar concentrators 125. The concentrators 125 can be movable so as to track daily and/or seasonal shifts in the sun's relative position. The solar concentrators 125 can include trough-shaped reflectors in some embodiments, and point-focus, linear Fresnel, and/or other concentrators in other embodiments. The collector outlet manifold 122 collects the heated water (e.g., in liquid and/or vapor phase) and delivers the heated water to a collector outlet 124. Balance valves 123 can control the manner in which water is distributed throughout the solar collector 120. In a particular embodiment shown in FIG. 1, the solar collector 120 includes a parallel arrangement of conduits 157a. In other embodiments, the solar collector 120 can include serial conduits and/or a combination of parallel and serial conduits. In any of these embodiments, the steam directed from the solar collector 120 to the collector outlet 124 can be directed through the heater 110 and/or combined with the heated water directed from the heater 110 to the heater outlet 116, and then directed to a combined or overall steam outlet 156. From the overall steam outlet 156, the steam is directed to the target 130. In any of these embodiments, the outlet temperature and vapor fraction at the collector outlet 124 will vary widely. At some times of day (e.g., under lower radiation conditions), the solar collector 120 will be fed low temperature water and deliver preheated water. At other times, the output of the solar collector 120 will be high-temperature, high-quality steam as is further discussed later with reference to FIGS. 2A-2D.

The water flow system 150, which connects the heater 110 and the solar collector 120 to the target 130, includes a network of conduits, multiple conduit junctions 155 and valves 154 that direct the flow of water and steam in accordance with a number of operational modes. For example, the water flow system 150 can include a first junction 155a and a corresponding first valve 154a that selectively direct water to the heater 110 and/or the solar collector 120. A second valve 154b positioned proximate to a second junction 155b, and a third valve 154c positioned proximate to a third junction 155c together direct flow exiting the first heater portion 113 to the second heater portion 114 and/or the solar collector 120. A fourth valve 154d positioned between a fourth junction 155d and a fifth junction 155e directs steam from the collector outlet 124 to the overall steam outlet 156 and/or through the second heater portion 114.

The controller 140 can include a programmable logic controller (PLC), a distributed control system (DCS), and/or another suitable type of control arrangement. For example, the controller 140 can constitute a plurality of separate control elements operating either as peers or in a hierarchical arrangement, e.g., interconnected as a SCADA system via fiber optic, wired, or wireless (radio-based) communication methods. The controller 140 receives inputs 141 and provides outputs 142 to direct the operation of the valves described above, the burner 111, and/or other system components. The inputs 141 can include signals received from a variety of sensors 143. Representative sensors can include a first temperature sensor 143a positioned to measure the water temperature at the water source 151, a second temperature sensor 143b positioned to measure the steam temperature at the collector outlet 124, a third sensor 143c positioned to measure the exhaust gas temperature at the burner exhaust 112, and/or any of a variety of other sensors, not shown in FIG. 1 for purposes of clarity. Such sensors can include flow rate sensors (e.g., to measure steam characteristics), $NO_x$ sensors, pH sensors, solar concentrator positioning sensors, solar radiation sensors, among others. The outputs 142 provided by the controller 140 can direct one or more actuators 144. In addition to actuators associated with each of the valves described above, the actuators 144 can include a first actuator 144a that controls the burner 111, and one or more second actuators 144b that control the concentrators 125 of the solar collector 120 (e.g., the motion of the concentrators 125 throughout the day and/or from season to season). These representative actuators 144 are shown for purposes of illustration, and it will be understood that the controller 140 can control other actuators of the overall system 100, which are not shown in FIG. 1 for purposes of clarity.

The controller 140 can operate in one of more of several manners. For example, in a feed-forward control arrangement, the controller 140 can receive inputs corresponding to a measured inlet water temperature and flowrate, a target outlet steam pressure and vapor fraction (steam quality), and determines the necessary enthalpy and associated fuel firing rate for the burner 111. In a feed-back control arrangement, the controller 140 can receive inputs corresponding to a measured inlet water temperature and flow rate, and an outlet flow rate, and can determine or approximate the current outlet steam quality based on one of a variety of measured physical or more properties, e.g., a change in conductivity of the outlet liquid, a change in velocity of the flow, and/or other properties, and/or a separate measurement of liquid and vapor components of flow (e.g., via isokinetic sampling). The controller 140 adjusts the burner firing rate and/or the liquid flow rate accordingly, e.g., to return the system 100 to a particular outlet steam quality. The controller 140 can incorporate measured solar radiation and a calculated sun position to determine an expected solar energy contribution to outlet enthalpy. By including measurements of solar radiation, the controller 120 can "anticipate" changes in the enthalpy at the solar collector 120 and adjust the burner firing rates more smoothly, adjust process controls more smoothly, and/or maintain tighter control of delivered steam characteristics.

In general, the thermal contribution from the solar collector 120 may be estimated and/or measured to provide feed-forward information to the burner and/or water flow rate controls. The thermal contribution from the solar collector 120 may be measured as inlet and outlet temperatures and pressures, and inlet and outlet flow-rates. The outlet flow will at some points in time be all liquid phase, and at some points in time be a liquid-vapor mixture. The steam quality at the solar collector outlet 124 can be calculated and, using the James equation or other well-known equations, may be used to calculate the enthalpy currently being added by solar energy, which may be combined with other information to generate an aggregate required enthalpy feed-forward signal to the burner 111.

In any of the foregoing and following embodiments, the system 100 can include temperature sensors mounted on the conduits 157a and/or other components of the solar collector 120 to estimate the solar energy contribution, e.g., in real-time or near real-time. In the lower temperature portion of the solar collector 120 (toward the inlet manifold 121), enthalpy is typically added as sensible heat, resulting in a rising wall temperature along the flow of liquid. The difference between temperature measurements taken on the conduits 157a at several points in solar collector 120 may be used to estimate the current and/or upcoming or projected solar heating intensity, and thus to estimate the total contribution of solar energy to the overall required enthalpy. This information, alone and/or combined with other measurements (e.g., direct measurements of solar radiation) can be used to estimate the corresponding required burner firing rate.

The controller 140 and associated sensors and actuators can include other features in addition to or in lieu of the foregoing features. Representative features include feedback based on exhaust gas temperatures, provisions for multi-fuel firing and/or handling fuel of varying BTU values at the burner 111, controlling the flow pattern throughout the system 100 to manage solar collector efficiency and stack gas temperature, managing/balancing optimal burner efficiency and optimal solar collector efficiency, controlling a flow of waste heat from an enclosure surrounding the solar collector to the burner inlet, and/or dumping heat at the solar collector 120, e.g., when the energy provided by the solar collector 120 exceeds the energy required by the target 130. The extent to which heat is dumped can depend on factors that include the local environmental conditions and/or the size of the solar collector 120 relative to the demands of the target 130 and the relative capacity of the heater 110. The foregoing control arrangements can include calculations that account for and/or make use of system characteristics, including that the coldest water provided to the solar collector 120 delivers the highest BTU output from the solar collector, and the lowest exhaust gas temperature delivers highest BTU output from burner 111.

FIGS. 2A-2D illustrate configurations of the system 100 shown in FIG. 1 in accordance with representative operational modes directed by the controller 140. In particular embodiments, the operational modes can be correlated with the time of day during which the system 100 operates. In other embodiments, the operational modes can be tied to other variables, including seasonal variables, and in still further embodiments, the system 100 can be configured to operate in modes other than those expressly shown in FIGS. 2A-2D and described below. In general, the controller 140 directs smooth, gradual transitions from one mode to another, e.g., to reduce or eliminate thermal shock, sudden fluid flow changes, and/or other potentially undesirable effects.

Figure 2A:
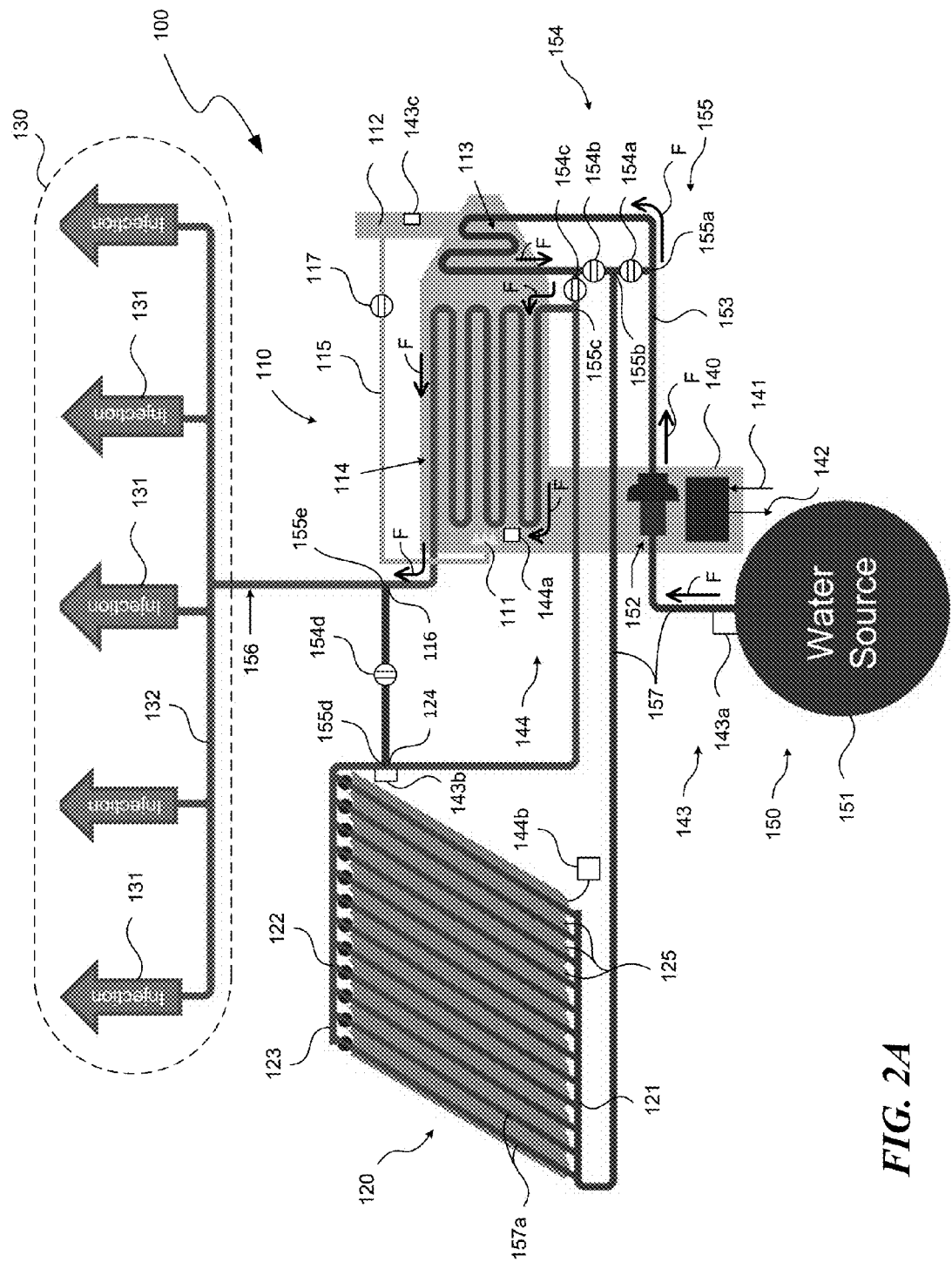
FIG. 2A is a partially schematic illustration of the system shown in FIG. 1, configured to operate at night in accordance with an embodiment of the presently disclosed technology.

FIG. 2A illustrates the system 100 configured in a representative first operational mode that, in at least some embodiments, corresponds to night-time operation. In this embodiment, the first valve 154a, the second valve 154b, and the fourth 154d are closed, and the third valve 154c is open. Accordingly, water travels from the water source 151 to the steam outlet 156 via the heater 110, and bypasses the solar collector 120, which is not active at night. In this mode, the water flow (indicated by arrows F) passes through the first heater portion 113, e.g., for preheating, then to the second heater portion 114, e.g., for further heating and phase change to steam, and then to the steam outlet 156 for delivery for to the target 130. The lack of flow through the solar collector 120 prevents the water in the conduits from flowing backwards to the solar collector 120 at the third junction 155c. Because the solar collector 120 is not active during the first operational mode, the burner 111 is typically operating at a high rate. The exhaust gas recirculation valve 117 can be opened or closed, depending upon the exhaust gas temperature and/or other factors. In general, the exhaust gas recirculation conduit 115 can be active (e.g., with the gas recirculation valve 117 open) when the energy cost for blowing or pumping the recirculating exhaust is less than the energy loss due to dumping high temperature exhaust gas to the environment and/or to control (reduce) emissions of $NO_x$ and/or other gases.

Figure 2B:
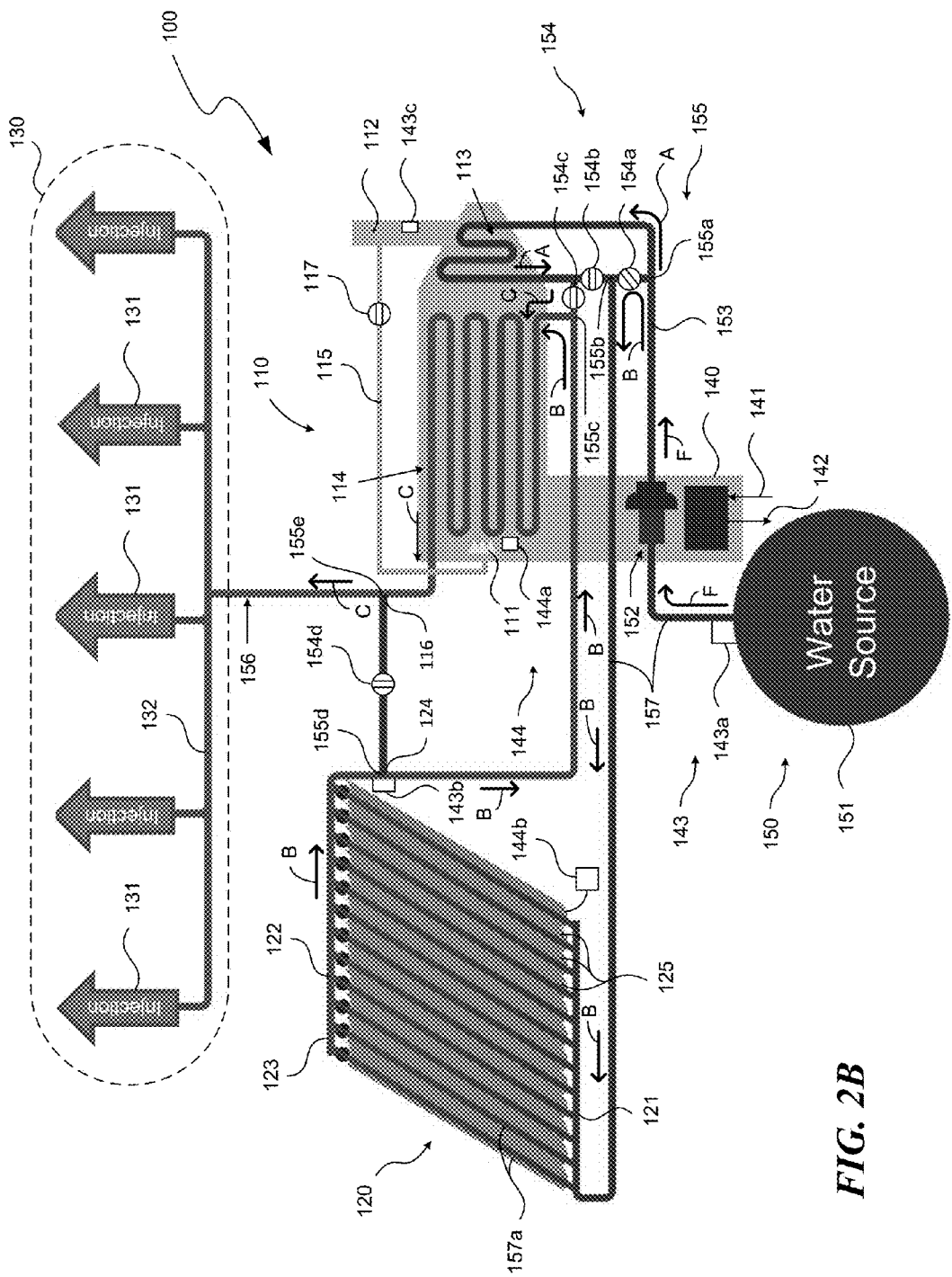
FIG. 2B is a partially schematic illustration of the system shown in FIG. 1, configured to operate under conditions of relatively low incident radiation, in accordance with an embodiment of the presently disclosed technology.

FIG. 2B illustrates the system 100 configured in a second operational mode, e.g., corresponding to a low incident radiation level at the solar collector 120. For example, the second operational mode can correspond to early morning, after sunrise. In this mode, the first valve 154a is partially opened. Accordingly, the flow of water indicated by arrow F splits at the first junction 155a into a first flow (indicated by arrow A) that is directed to the first heater portion 113, and a second flow (indicated by arrow B) that is directed to the solar collector 120. The first flow passes through the first heater portion 113 to the third junction 155c. The second flow is directed to the solar collector 120. At the solar collector 120, the solar concentrators 125 are positioned to focus the incident solar radiation to heat the water passing through the conduits 157a. The heated water passes through the collector outlet 124 and combines with the first flow at the third junction 155c to produce a combined flow (indicated by arrow C). The combined flow passes through the second heater portion 114 and is provided to the steam outlet 156 for delivery to the target 130. For purposes of illustration, the first valve 154a is shown partially open and the third valve 154c is shown fully open in FIG. 2B. In other embodiments, the relative positions of these valves can be reversed, or both valves can be partially open, depending upon factors that can include, but are not limited to, the relative pressure drops through the heater 110 and the solar collector 120, respectively.

During the course of the early morning, as solar radiation received at the solar collector 120 intensifies, more and more flow is directed to the solar collector 120, and less flow is directed to the first heater portion 113, by further opening the first valve 154a. In addition, as the heat output produced by the solar collector 120 increases (e.g., in the form of sensible heat and/or latent heat), the burner 111 is turned down to reduce unnecessary fuel consumption. In typical arrangements, the burner 111 has different performance characteristics at different operating points, which is accounted for in determining how far to turn the burner 111 down. In general, it is more efficient to turn the burner 111 down than to stop and restart the burner 111. As the flow of water through the first heater portion 113 is reduced, the temperature at the burner exhaust 112 may rise, even though the burner 111 is turned down, due to the reduced amount of exhaust gas heat transferred to the water in the first heater portion 113. The increased burner exhaust temperature can reduce the net efficiency of the fuel-fired portion of the system (e.g., the heater 110), even while the exhaust gas recirculation conduit 115 is active. To reduce or eliminate such inefficiencies, the system 100 can move to a third operational mode, described below with reference to FIG. 2C.

Referring now to 2C, in the third operational mode, the first valve 154a and the third valve 154c are closed, and the second valve 154b is opened. Accordingly, the flow of water indicated by arrows F passes first through the first heater portion 113, then to the solar collector 120, and then to the second heater portion 114 before being delivered to the steam outlet 156 and the target 130. In this embodiment, the solar collector 120 adds a significant amount of heat to the water, producing low to medium quality steam, and the second heater portion 114 increases the quality of the steam to a level suitable for the target 130. Typical quality levels at the steam outlet 156 range from about 65% to about 80%, but can vary outside this range in particular embodiments. Typical pressures can be from about 400 psi to about 2800 psi, although these values, too, may be different in other embodiments. In any of these embodiments, the system 100 can quickly respond to intermittent changes in the heat output provided by solar collector 120. For example, if a cloud passes between the solar collector 120 and the sun, temporarily reducing the heat output of the solar collector 120, the burner 111 can be quickly turned up to supplement the heat provided by the solar collector 120. The burner 111 can be quickly turned down again when the cloud cover has passed. If the sun remains behind a cloud for extended periods of time, the system flows can be readjusted in a gradual manner to rebalance the system 100, e.g., by reverting to the second operational mode (FIG. 2B) or the first operational mode (FIG. 2A).

During at least some seasons (e.g., midsummer), and at least some hours (e.g., around midday), the system 100 can enter a forth operational mode (shown in FIG. 2D) corresponding to a peak level of incident radiation received at the solar collector 120. In this mode, the fourth valve 154d can be at least partially opened to produce a first flow (indicated by arrows A) passing through the second heater portion 114, and a second flow (indicated by arrows B) passing directly from the solar collector 120 to the fifth junction 155e. At the fifth junction 155e, the two flows combine to produce a combined flow (indicated by arrow C) at the steam outlet 156. In this mode, the burner 111 can be further turned down, while a sufficient flow of water is directed through both the first heater portion 113 and second heater portion 114 to prevent these portions from drying out or otherwise degrading due to low flow conditions. In at least some cases, the peak steam production capacity of the solar collector 120 can exceed the input needs of the target 130. In such instances, excess steam or heat can be diverted to other uses (e.g., thermal storage and/or thermoelectric power generation via a steam-powered turbine generator 131 or other suitable device), or some of the solar concentrators 125 can be moved to an off-focus position to reduce excess output.

Suitable thermal storage techniques and systems include (a) passing the heated water through a heat exchanger (e.g., with liquid salt, thermal oil, or another suitable composition as a working fluid in thermal, but not fluid, communication with the water); (b) embedding steam conduits in concrete or another thermal storage medium, including in some cases, a phase change material; and/or (c) using a wet steam accumulator. In any of these embodiments, the excess steam production can result from an output by the solar collector 120 that exceeds the output of the heater 110 alone. In some cases, this excess steam capacity may be used by the target 130 (e.g., an oilfield) as oil production expands over the life of a typical thermal EOR project. Suitable thermal storage media and associated techniques are described further below with reference to FIGS. 7A-7E.

The injection wells 131 can accept steam flow at a rate determined by characteristics including the diameter and depth of the injection wells, their downhole completions, and by characteristics of the formation including downhole pressure and injectivity (resistance to flow). As steam injection and oil production proceed during the life of a thermal recovery project, downhole pressure and injectivity change. Typically downhole pressure is reduced in an effort to make steam more effective, and injectivity rises as the areas of the formation surrounding the injector well heat up and experience other physical changes associated with steam and oil production. Accordingly, the peak rate of steam flow down an individual injector well for a given wellhead steam pressure will typically rise from the initial value when the well is first completed and steam injection commences. Accordingly, a solar-versus-fuel-fired steam balance may be planned to change over the early life of a steamflood project, because higher peak rates become possible and as a result a higher total amount of steam may be delivered during daylight hours (when solar steam generation is operating), and the burner 111 may be turned down more deeply. Similarly, an installation of steam generation may be planned which during the early life of the field requires dumping solar energy during peak-radiation periods, whereas later during the life cycle, less or no dumping is required as the system can accommodate higher peak flows.

Figure 2C:
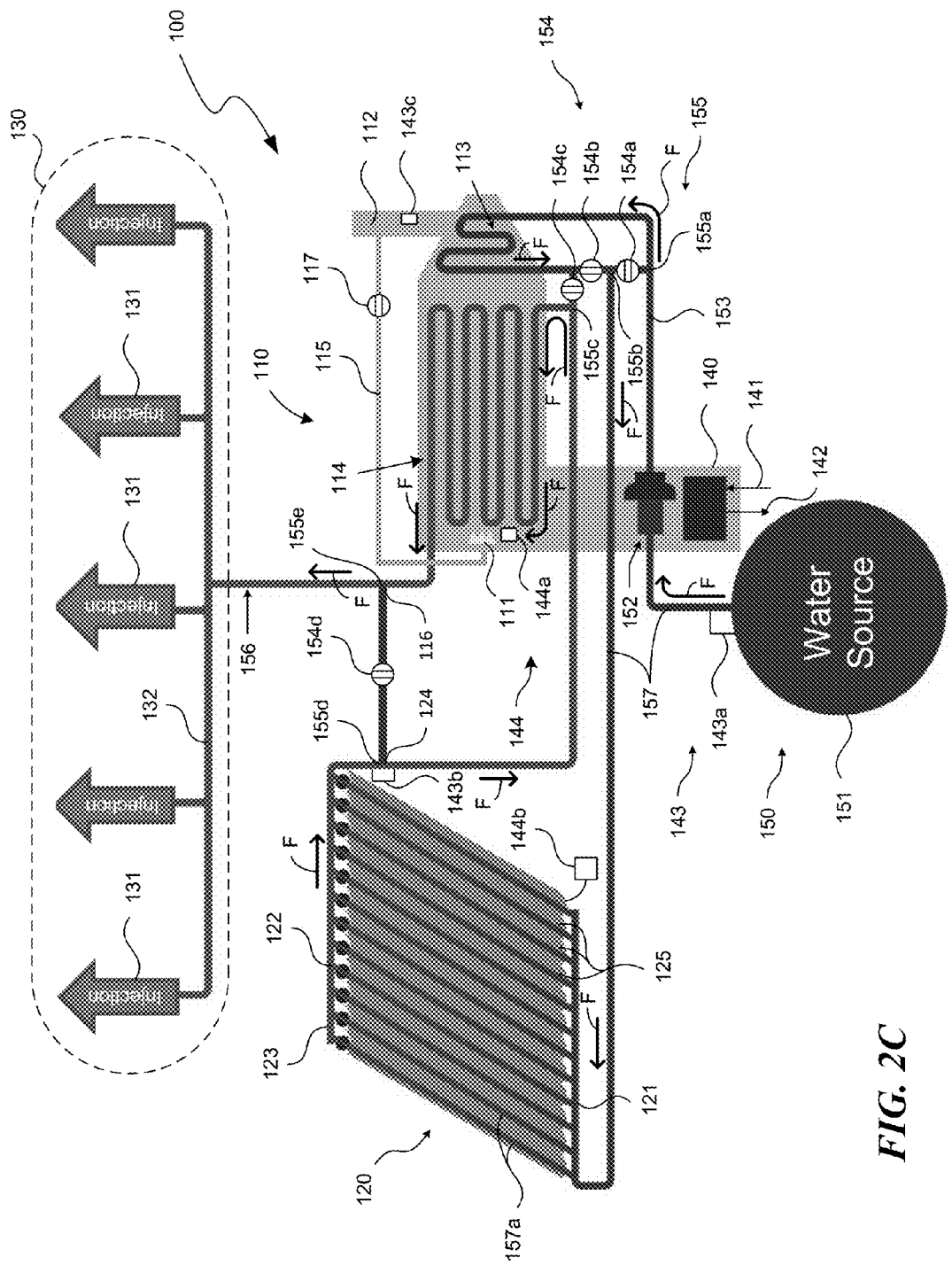
FIG. 2C is a partially schematic illustration of the system shown in FIG. 1, configured to operate under conditions of relatively high incident radiation, in accordance with an embodiment of the presently disclosed technology.
Figure 2D:
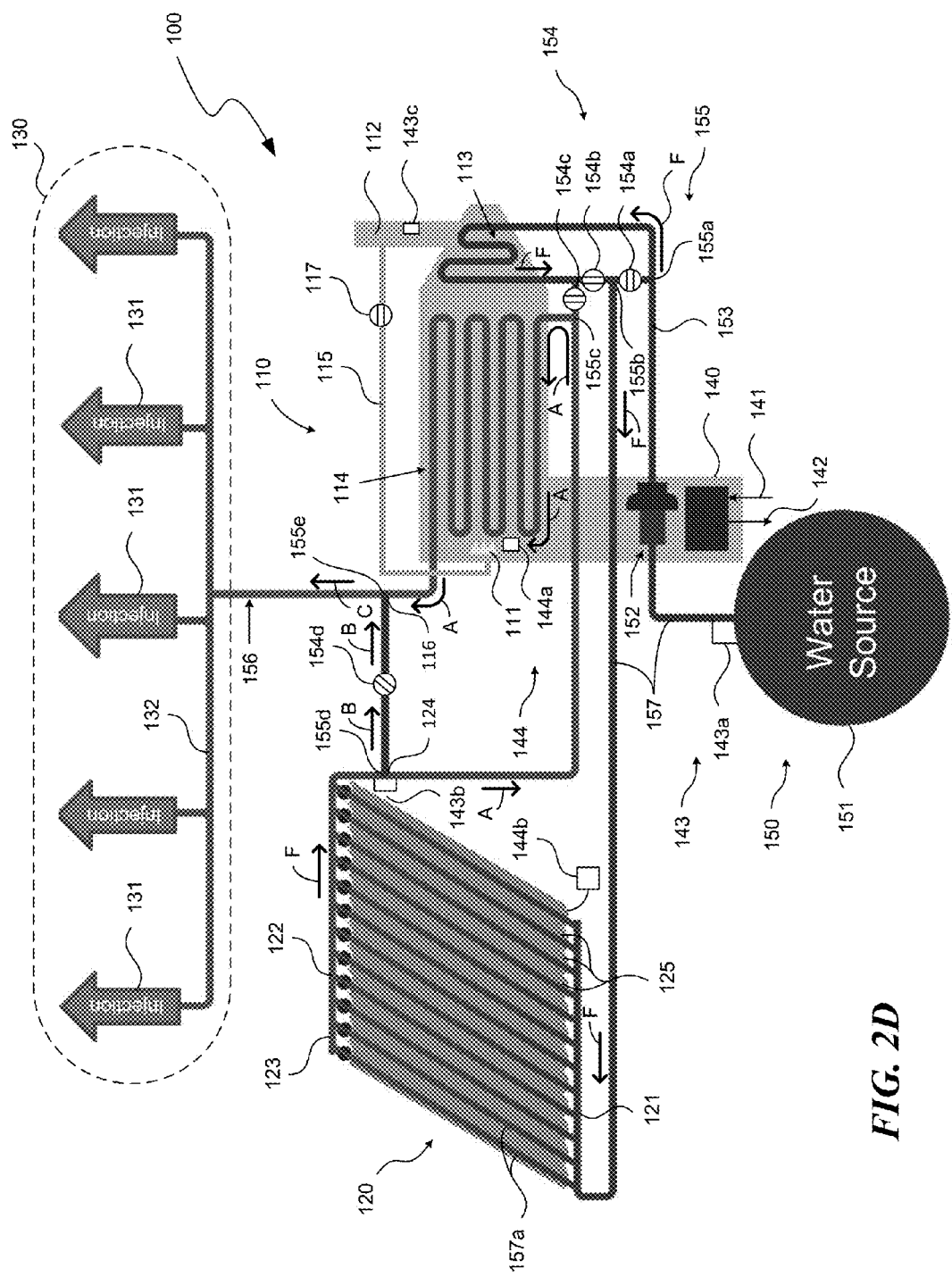
FIG. 2D is a partially schematic illustration of the system shown in FIG. 1, configured to operate under peak incident radiation conditions, in accordance with an embodiment of the presently disclosed technology.

In any of these embodiments, after the peak incident radiation period has passed, the system 100 can revert to the third mode shown in FIG. 2C. As the incident sunlight further wanes toward the end of the day, the system 100 can then revert to the second mode shown in FIG. 2B, and as night falls, can revert to the first mode shown in FIG. 2A. As the system 100 transitions to night time operation (the first operational mode), the water passing through the solar collector 120 absorbs residual heat from the solar collector 120. Accordingly, by the time the solar collector 120 is isolated from the water flow passing through the heater 110, the residual heat remaining in the solar collector has been effectively absorbed by the water and converted to steam, thus reducing or eliminating what would otherwise be radiation losses from the solar collector 120 at night.

One feature of an embodiment of the system 100 described above is that it can include a single heater that can be coupled to the solar collector 120 in parallel or in series, depending on the operational mode. For example, in the first operational mode shown in FIG. 2A, the first and second heater portions 113, 114 operate in series with each other, and the solar collector 120 is excluded from the circuit. In the second operational mode shown in FIG. 2B, the first heater portion 113 of the heater operates in parallel with the solar collector 120, and the second heater portion 114 operates in series with the solar collector 120. In the third operational mode shown in FIG. 2C, both the first and second heater portions 113, 114 operate in series with the solar collector 120, with the first heater portion 113 coupled upstream of the solar collector 120, and the second heater portion 114 coupled downstream of the solar collector 120. In the fourth operational mode shown in FIG. 2D, the first heater portion 113 operates in series with the solar collector 120, and the second heater portion 114 operates in series with only a part of the flow exiting the solar collector 120. Accordingly, the controller can control the flow of water through the system, and can direct the water through the solar collector 120 and the heater 110 in accordance with different sequences. In particular embodiments, one portion of the flow is directed through the solar collector and the fuel-fired heater in accordance with a first sequence, and the same (or a different) portion of the flow is directed through the solar collector and the fuel-fired heater in accordance with a second, different, sequence.

As a result of the forgoing multiple operational modes, the output provided by the solar collector 120 can be improved (e.g., optimized) to take best advantage of the incident solar radiation, and the output provided by the heater 110 can be improved (e.g., optimized) to supplement the output provided by the solar collector 120, as needed, and to improve or optimize the efficiency with which the heater 110 operates. This is unlike typical existing arrangements which include heaters arranged only in series or only in parallel.

As noted above, the system 100 can operate in at least the foregoing operational modes with only a single heater 110 in addition to the solar collector 120. The single heater can include multiple heater conduits and flow paths, multiple burners and multiple heater portions, but in at least some embodiments, hot gas flow from the burner(s) passes serially over at least two water-carrying portions, (e.g., the first portion 113 and the second portion 114), each of which can carry an individually-controllable flow of water. This arrangement can reduce the number of heaters used to supplement the solar collector 120, while at the same time providing the flexibility to increase efficiencies in both the solar collector 120 and the heater 110 as conditions change.

Another advantage of the foregoing arrangements is that embodiments of the system 100 do not include a separator that separates low quality steam and/or water from high quality steam. Instead, any steam that may have less than the desired quality level passes through the heater 110 to provide sufficient control over the quality of steam provided to the target 130.

Another feature of at least some of the foregoing embodiments is that they can take advantage of the ability to turn down the burner 111, thus reducing fuel consumption that may be unnecessary in light of the heat provided by the solar collector 120. Accordingly, it is desirable to include a burner 111 that has a deep turndown ratio so that the highest total fraction of solar steam may be provided to the target 130. Typical fuel-fired burners 111 have a limited turndown ratio. These limits can be due to the operational characteristics of the burner 111 itself. For example, the burner 111 will typically deliver a stable, clean (low-emission) flame only within a designed operating range. The turndown ratio of the burner 111 may also depend on whether the burner 111 is capable of being operated with more than one fuel, for example, diesel or natural gas, or gas with a varying range of heating values. The turndown ratio of the burner 111 may also depend on whether features such as exhaust gas recirculation are used to reduce the emissions of certain combustion products, such as nitrogen oxides ($NO_x$). The ability to turn down the burner 111 is also restricted by the need to maintain effective mixing flow across the heat exchanger surfaces within the heater 110 (e.g., at the first heater position 113 and/or the second heater position 114). If an inadequate air flow is provided to the heater portions 113, 114, the temperature at the burner exhaust 112 will increase, increasing the amount of heat dumped to the environment. If the flow of water through the heater 110 is inadequate, the heat exchanger tubing in the first heater portion 113 and/or the second heater portion 114 may overheat, causing the tubes to rupture and/or the temperatures at the burner exhaust 112 to increase, again increasing maintenance costs and reducing overall efficiency.

The foregoing turndown limitations can be accommodated with the system configuration shown in FIG. 1. For example, in both the second and third operational modes (FIGS. 2B and 2C, respectively), the full flow of water is routed through the second heater portion 114, reducing or eliminating the likelihood that the flow of water through the second heater portion 114 will be inadequate. In the first, third and fourth operational modes (FIGS. 2A, 2C and 2D, respectively), the full flow of water is directed through the first heater portion 113, reducing or eliminating the likelihood for inadequate flow during these modes. During the second mode, the first valve 154a can be monitored so as to continue providing adequate flow to the first heater portion 113 as an increasing amount of flow is directed to the solar collector 120. Because the first heater 113 operates at lower temperatures than the second heater portion 114, the first heater 113 can tolerate a greater reduction in flow. The system 100 can be sized so that even when some flow bypasses the second heater portion 114 in the fourth operational mode, an adequate flow is provided. In this mode, the total flow through the system can be increased relative to the flow provided during the first, second, and third operational modes.

Another feature of embodiments of the system described above include a single (or in some embodiments, an integrated) controller arrangement that monitors and controls both the solar collection 120 and the heater 110 to produce the desired flow rate and steam quality delivered to the target 130. This can be a peer relationship established between two separate controllers, or a hierarchical relationship where, e.g., a master controller communicates with a solar controller and a heater controller, or a single controller provides such communication. This is unlike conventional arrangements for which these two control and monitoring functions are separated, which can be more costly and less efficient to implement than the presently described technology. Embodiments of the present systems can also reduce the number of overall system components because several components are shared by the solar collector 120 and the heater 110. These components include a single inlet device 152 that directs flow to both the solar collector 120 and the heater 110, and a single overall steam outlet 156.

Still another feature of embodiments of the system described above is that flow rates through the solar collector 120 can be relatively high at both low and high incident radiation conditions. At low incident radiation conditions, the second heater portion 114 supplements, as needed, heat produced by the solar collector 120. At high incident radiation conditions, the high flow rate reduces excessively high temperatures at the solar collector 120, which would otherwise increase radiation losses. Such losses can be significant, as these are proportional to temperature raised to the fourth power. In particular, elements of the solar collector 120, e.g., the collection conduits or other receivers, are generally uninsulated so as to facilitate absorbing solar radiation. As the temperature of the receivers increases, losses increase at a very high rate (as $T^4$). Accordingly, it may be desirable in at least some embodiments to keep the solar collector 120 (or portions of the solar collector 120) at lower rather than higher temperatures. This can be accomplished, for example, by having a greater portion of the solar collector 120 elevate the water toward the vaporization temperature, and a lesser portion of the solar collector 120 evaporate the water (change its phase) and/or elevate the vapor beyond the vapor transition temperature. Aspects of the system 100 allow the operator to optimize, for each radiation condition, the efficiency of the solar collector 120 and the heater 110. Flow is apportioned between the first portion 113 of the heater 110 and the solar collector 120 based on consideration of the simultaneous efficiency of each for the currently available solar radiation.

Figure 3:
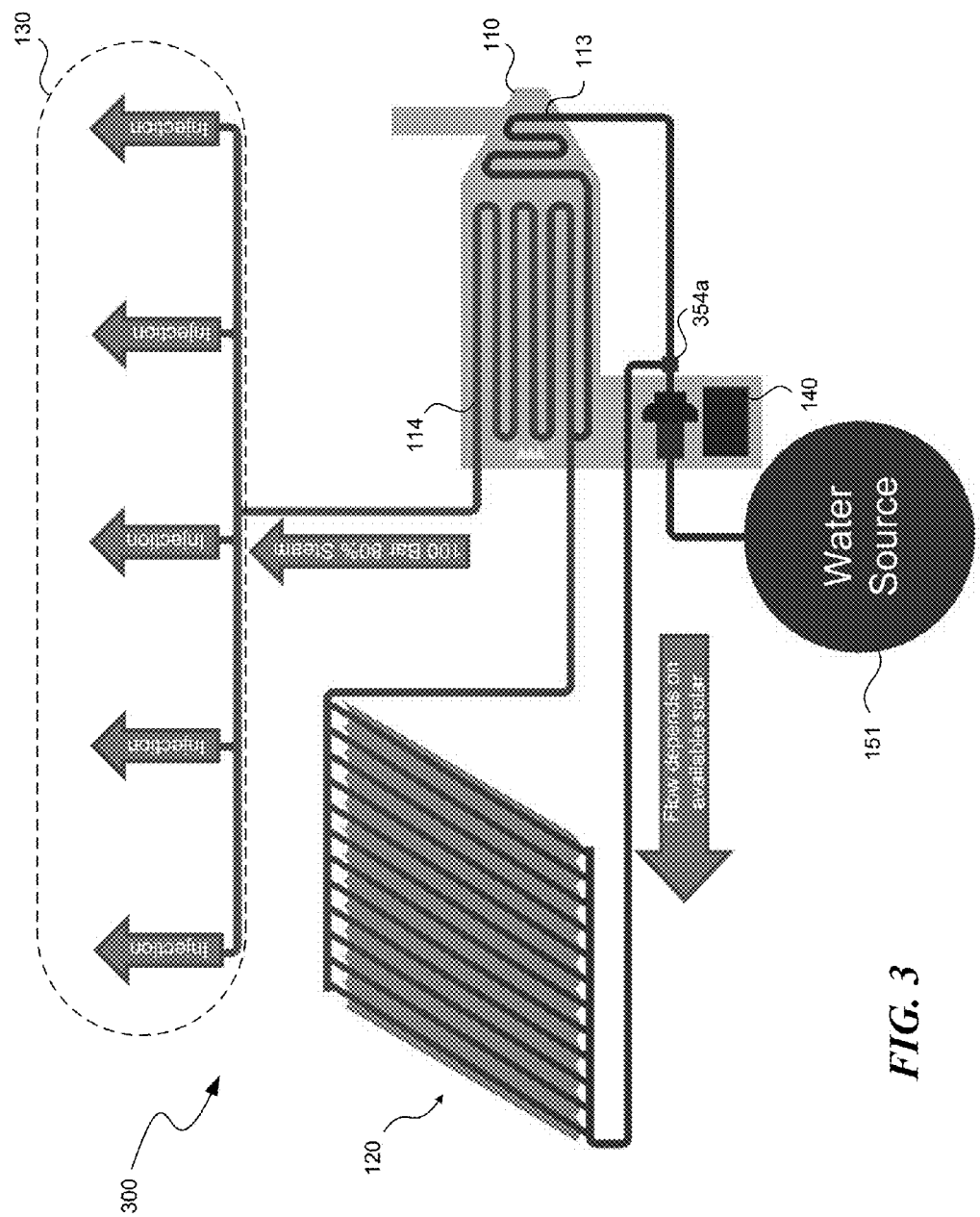
FIG. 3 is a partially schematic illustration of a system configured in accordance with another embodiment of the present technology.

FIG. 3 is a partially schematic illustration of a system 300 that can include fewer valves than the system 100 described above, in accordance with another embodiment of the present technology. The system 300 includes several features similar or identical to the corresponding features shown in FIG. 1, including a water source 151, a heater 110, a solar collector 120, a controller 140, and a target 130. The system 300 further includes a first valve 354a but may not include corresponding second, third, and fourth valves such as those shown in FIG. 1. Instead, the first valve 354a can be selectively adjusted to (a) direct all the water from the water source 151 through the heater 110 (and no water through the solar collector 120), or (b) a first portion of the water through the heater 110 (in particular, the first portion 113 of the heater 110) and another portion of the water through the solar collector and the second portion 114 of the heater 110, or (c) all the water from the water source 151 through the solar collector 120 and the second portion 114 of the heater 110. This arrangement provides for better efficiency than an arrangement in which the heater 110 and the solar collector 120 are in a fixed parallel configuration. For example, this arrangement can provide improved efficiency during the early part of the day, as discussed above with reference to FIG. 2B, and can isolate the solar collector 120 and recapture residual heat from the solar collector 120, in a manner generally similar to that discussed above with reference to FIG. 2A. In addition, with the arrangement shown in FIG. 1, the arrangement shown in FIG. 3 does not include a separator.

Figure 4:
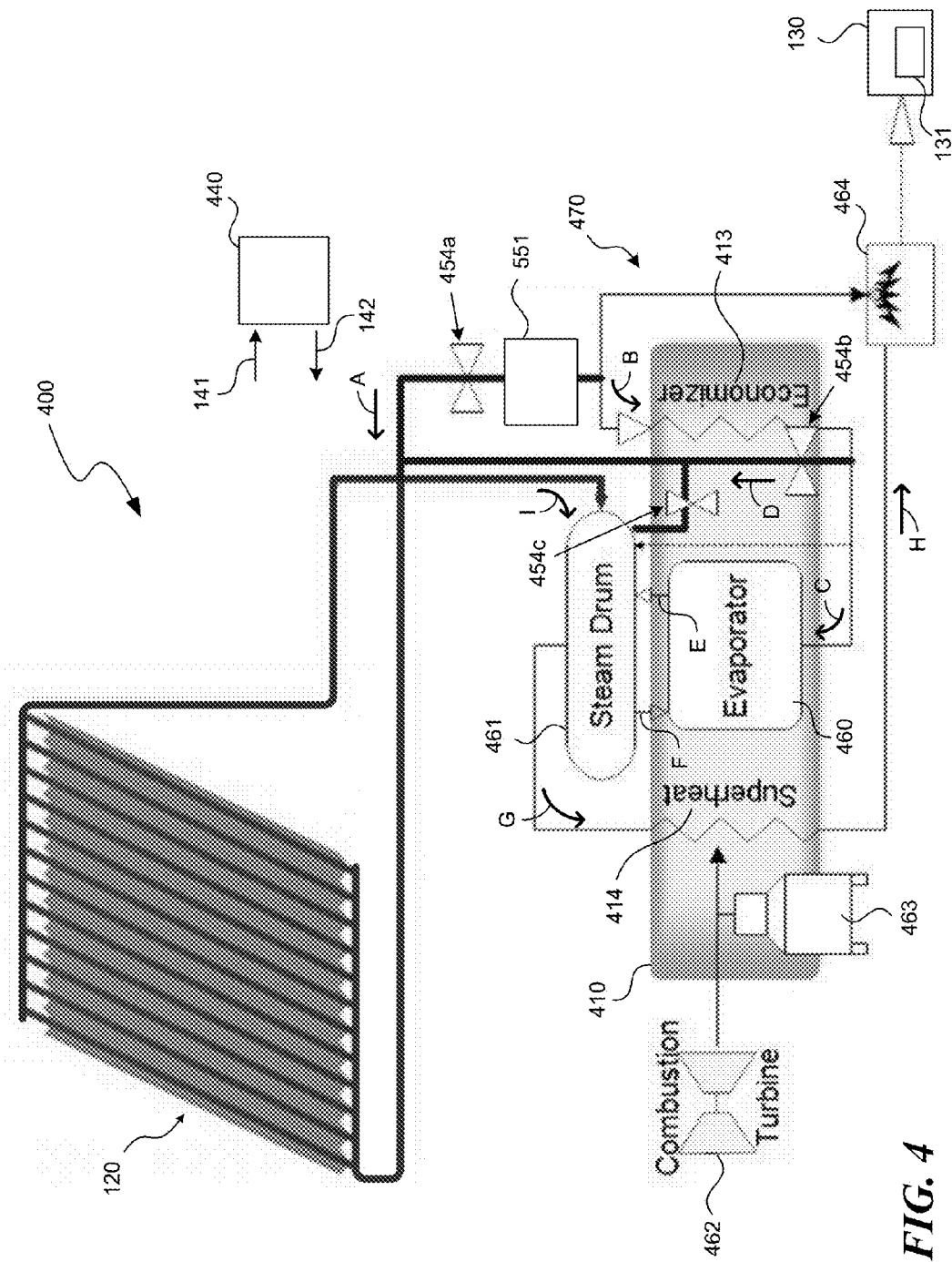
FIG. 4 is a partially schematic illustration of a system configured in accordance with still another embodiment of the present technology.

FIG. 4 is a partially schematic illustration of a system 400 that includes a heat recovery steam generator 470, in accordance with still another embodiment of the present technology. The heat recovery steam generator 470 can include a combustion turbine 462 that provides hot exhaust gases to a heater 410. The exhaust gases can optionally be further heated via a supplemental heater 463 (e.g., a duct heater). The heater 410 can include a first portion 413 (e.g., an economizer) positioned downstream in the exhaust gas flow path from a second portion 414 (e.g., a superheat portion). The heater 410 can further include an evaporator 460 positioned upstream of the first portion 413. In other embodiments the evaporator can have other locations, e.g., upstream of the second portion 414. A steam drum 461 is positioned to collect liquid and/or vapor phase water and separate the vapor phase water from the liquid phase water. A water source 551 directs water to the solar collector 120 and/or the heat recovery steam generator 470, depending, for example, upon the settings of a first valve 454a, a second valve 454b, and a third valve 454c. The valves and other features of the system 400 are under the control of a controller 440 that receives inputs 141 and directs outputs 142.

In operation, the water source 551 can direct water to the solar collector 120 alone, to the heat recovery generator 470 alone, or to both the solar collector 120 and the heat recovery generator 470, depending upon the position of the first valve 454a. Water directed to the solar collector 120 (as indicated by arrow A) returns to the steam drum 461, as indicated by arrow I. Water directed to the heat recovery steam generator 470, as indicated by arrow B, passes through the first portion 413 and then to the evaporator 460 (as indicated by arrow C), and/or around the evaporator 460 (as indicated by arrow D). Water directed to the evaporator 460 is evaporated and passes to the steam drum 461 as indicated by arrow E. Condensate from the steam drum 461 returns to the evaporator 460 as indicated by arrow F. Vapor passes from the steam drum 461 to the second portion 414 as indicated by arrow G. After being heated at the second portion 414, the vapor can optionally pass through an attemperator 464 that sprays water received from the water source 551 into the steam flow to manage the temperature of the steam, which is then directed to the target 130.

Water bypassing the evaporator 460 (as indicated by arrow D) can pass directly to the steam drum 461, and/or to the solar collector 120, depending upon the position of third valve 454c.

In the embodiment shown in FIG. 4, the system 400 includes a heat recovery steam generator 470 coupled to the solar collector 120 in a manner that achieves at least some of the features and advantages described above. For example, the system 400 can selectively direct water to the solar collector 120 and/or the heater 410. The system can recapture heat from the solar collector 120 during and/or approaching night time operation, in a manner generally similar to that described above with reference to FIGS. 2A-3.

One feature of many of the embodiments described above is that the embodiments can include a heater (e.g., a boiler) with a pre-heat section, in combination with a solar concentrator, both of which receive the same working fluid throughout. This arrangement can be configured in accordance with a number of operational modes to enhance the overall efficiency of the system. In particular, the systems can be optimized to efficiently provide a target quantity and quality of steam, accounting for a wide variety of factors that include radiative losses at the solar collector 120, and fuel use at the heater. The thermal efficiency of the solar collector is loosely determined by the temperature of the receiver elements at the solar collector, the inlet temperature of the water at the solar collector, the flow rate of water through the solar collector, the collected radiation. The efficiency of the heater can be defined by a variety of parameters, including the inlet water temperature, flow rate, exhaust gas temperature, and the fuel burn rate. The overall system can be configured to increase the efficiency of, and/or optimize the operation of, the steam generation process by adjusting the interactions between the heater and the solar collector. This flexible arrangement provides for efficient operation despite varying environmental conditions.

Figure 5:
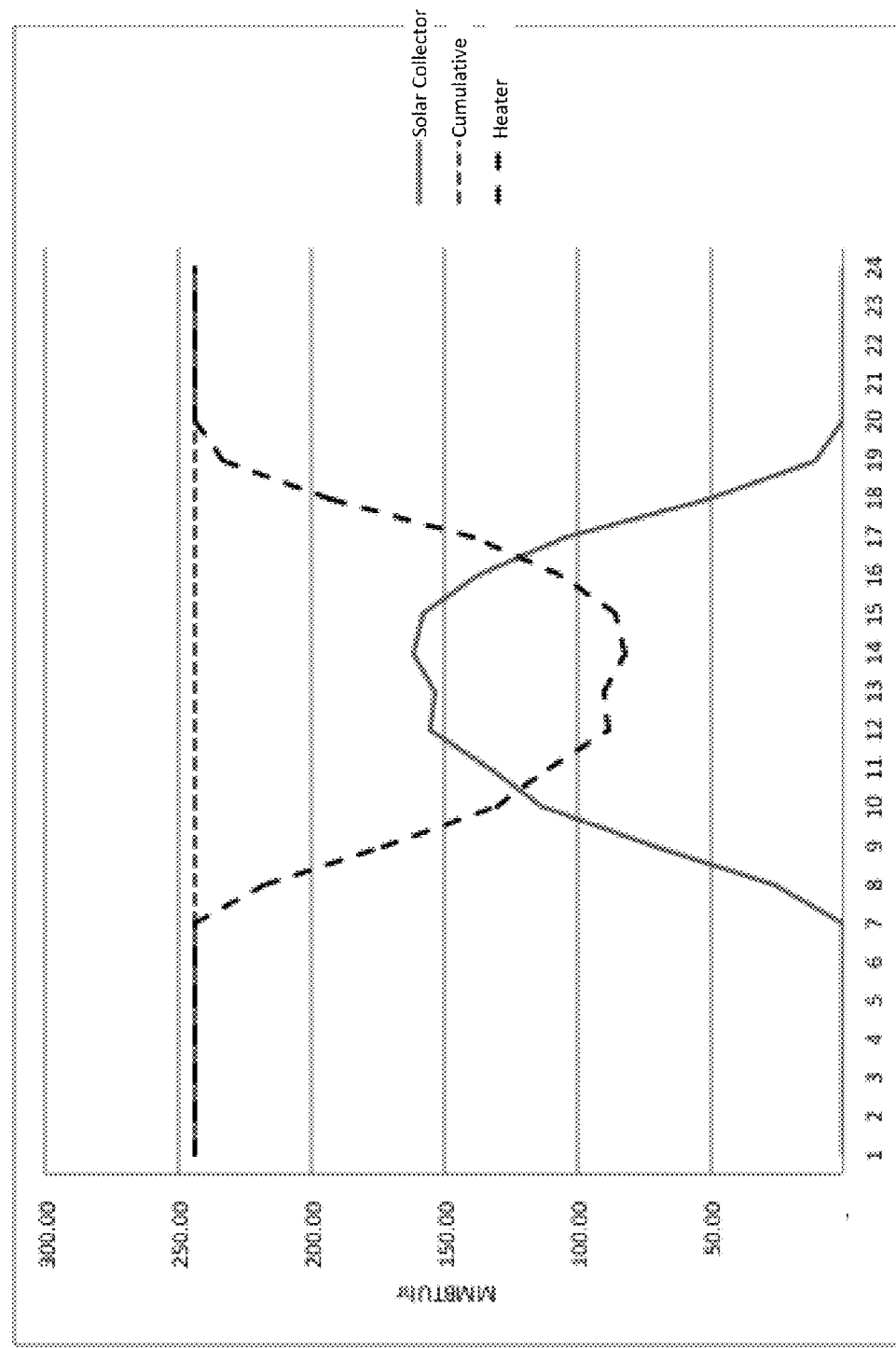
FIG. 5 is a graph illustrating representative heat contributions from a solar collector and heater in accordance with several embodiments of the present technology.

FIG. 5 is a representative graph illustrating the heat contribution provided by a representative heater and a solar collector, along with the cumulative heat provided by both, as a function of hours during a typical day of operation. As shown in FIG. 5, the system can be tailored to provide a generally constant cumulative heat output by varying the heat contribution provided by the heater as the heat contribution provided by the solar collector increases and decreases during the course of the day.

Figure 6:
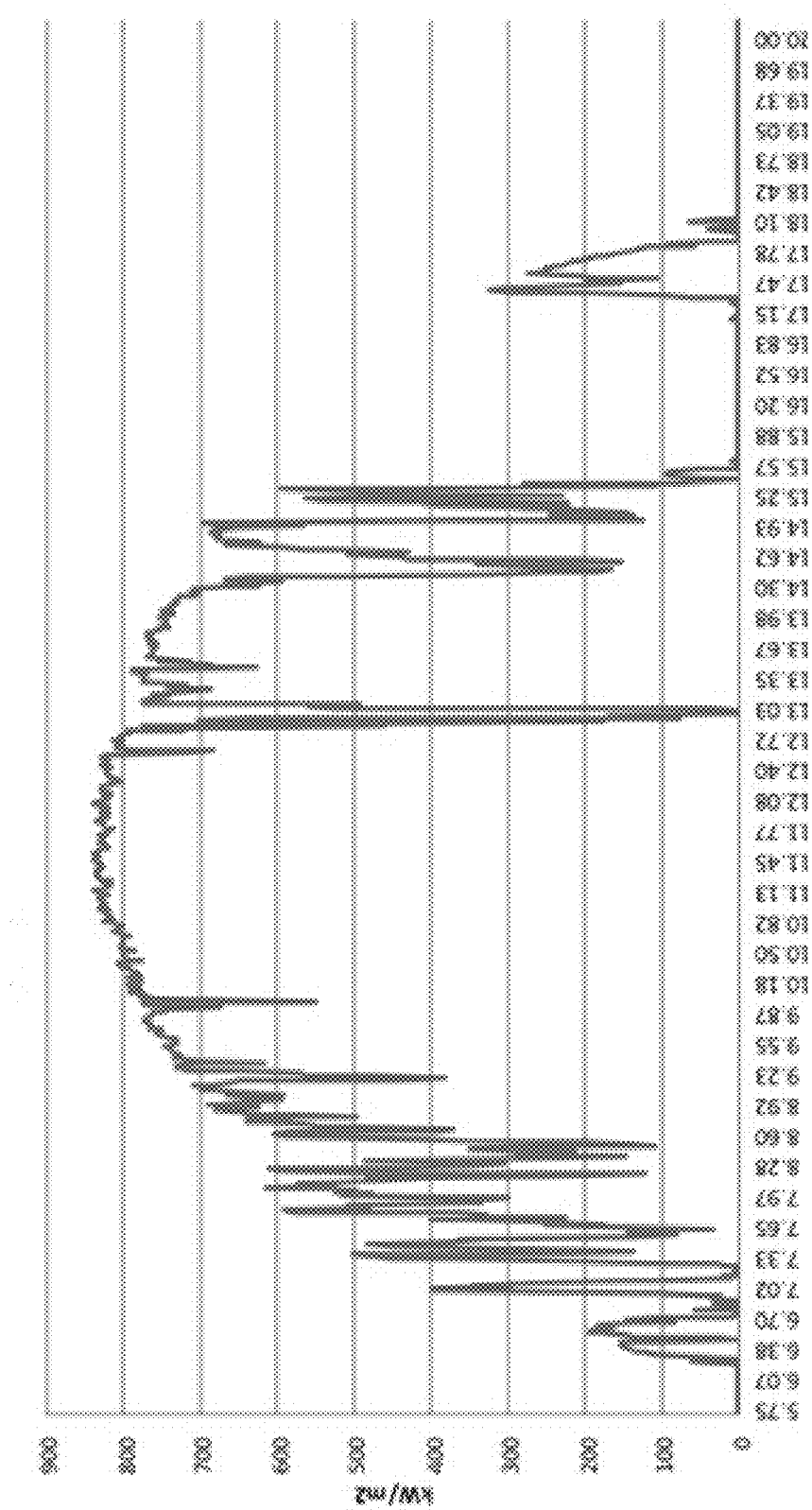
FIG. 6 is a graph illustrating representative variations in solar radiation levels over the course of a day.

FIG. 5 illustrates general variations in the heat contribution provided by a solar collector. FIG. 6 illustrates with more granularity the variation in the radiation incident on the solar collector during typical operation. As is evidenced from FIG. 6, the incident solar radiation can vary significantly, and can vary quickly. As discussed above, embodiments of the present technology include a heater operatively integrated with the solar collector to account for such variations while still providing a uniform quality and quantity of steam, as may be required by the target user.

Particular embodiments of the systems described above experience time-varying average temperatures at the solar collector, which are managed in such a manner as to optimize (or at least improve) total steam output as a function of fuel firing. Based on expected current energy production (e.g., based on radiation/time of day), the systems can apportion boiler feedwater flow rates and flow patterns in the manners described above. At least some conventional systems focus on adjusting the flow rates in a solar boiler so as to achieve a particular outlet steam temperature or outlet steam condition, holding that steam condition a constant. By contrast, embodiments of the present technology focus on achieving the greatest combined efficiency, integrated over a fuel-fired heater and solar steam generator. The controller can apportion flow rate and flow patterns so as to optimize, or at least improve, the total steam produced by the combination—balancing efficiency losses in the fuel-fired boiler due to effects of reduced liquid flow causing higher stack temperatures, against efficiency losses at the solar collector, which vary strongly with the temperature of the collector. The controller manages the combined system in such a way (e.g., via the modes described above) that during lower-radiation periods, the solar field collector is operating at lower average temperatures than a parallel arrangement would provide. Embodiments of the systems can monitor and respond to both the water inlet temperature and the system outlet temperature, as well as the outlet steam quality. As the efficiency of a solar collector varies strongly with its receiver temperature (since radiation losses vary as $T^4$), lowering the temperature (e.g., the average temperature and/or the peak temperature) can significantly improve the overall system efficiency.

The temperature of the steam in particular embodiments of the present technology is ultimately determined by the system outlet pressure, and in particular, the saturation temperature for that pressure. In a pure solar boiler, inlet water flows through the solar collector, rising in temperature until it begins to boil. As boiling water flows through the tubes, its temperature changes little as more thermal energy is added, driving the phase change from liquid to vapor phase until enough energy has been added to complete the conversion to steam. However, in a typical operating mode for embodiments of the presently disclosed systems, the outlet quality is less than 100% steam. As a result, the temperature profile of the solar collector is determined by the currently available solar radiation, the inlet feedwater temperature, and the inlet flow rate. Higher flow rates will reduce the outlet steam quality (perhaps to 0) and will push the boiling point in the collector further downstream. Lower inlet water temperatures will have the same effect. However, flow diversion from away from the heater and to the solar collector will raise the exhaust gas temperature at the heater and reduce its thermal efficiency proportionally. Aspects of the present technology are direct to balancing these countervailing effects. For each radiation condition, for each size of solar collector and fuel-fired boiler, with their respective efficiency curves, there exists an optimum operating point at which the combined efficiency of the two is maximized or at least improved. The controller logic can be configured to achieve or approximately achieve this operating point.

FIGS. 7A-7E illustrate systems in accordance with still further embodiments of the present technology. These systems include thermal storage functions and/or close proximity between the solar collector and the heater, with both features configured to increase the overall efficiency with which steam is generated and provided to an oil field or other target site. Several features of the systems shown in FIGS. 7A-7E are common to those described above with reference to FIGS. 2A-2E and are therefore shown and/or described below with less detail. Such features will typically operate in manners generally similar to those described above with reference to FIGS. 2A-2E.

Figure 7A:
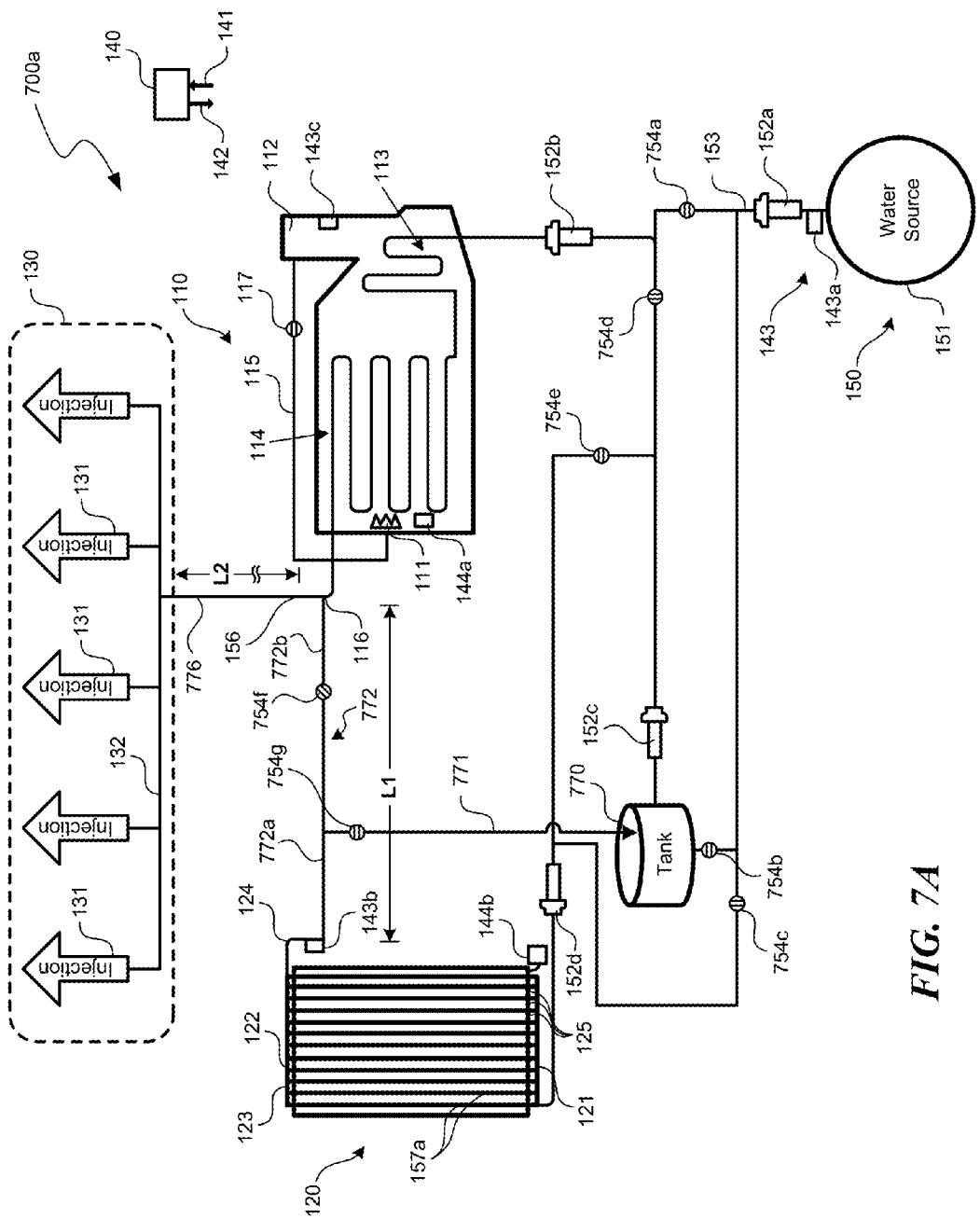
FIG. 7A is a partially schematic illustration of a system that includes a storage medium configured in accordance with an embodiment of the present technology.

FIG. 7A illustrates a system 700a that includes a solar collector 120, a heater 110, and a water flow system 150 coupled together to provide steam at an overall steam outlet 156, which is directed to a target 130. The water flow system 150 can include one source of multiple (e.g., distributed) sources. Individual sources can operate autonomously or can be interconnected, depending upon the embodiment. In addition, the system 700a can include a storage medium 770, e.g. a tank or other suitable medium, that stores water or another working fluid in such a manner as to preserve the thermal energy of the working fluid for later use. Accordingly, the storage medium 770 can include insulation and/or other features that reduce thermal losses.

The system 700a can include a series of pumps 152a-152d (referred to collectively as pumps 152) and valves 754a-754g (referred to collectively as valves 754) that direct the water or other working fluid in a variety of manners depending upon the operational mode. For example, as shown in FIG. 7A, the system 700a can include a water source 151 that provides water to a first pump 152a. The first pump 152a can direct the water to the heater 110 via a first valve 754a and a second pump 152b, or can direct the water to the storage medium 770 via a second valve 754b. A third valve 754c controls whether the water directed from the water source 151 is provided to the storage medium 770 or to the solar collector 120. Water released from the storage medium 770 can be directed via a third pump 152c to the solar collector 120 or to the heater 110, depending upon the settings of a fourth valve 754d and a fifth valve 754e. Water directed to the solar collector 120 can be further pressurized by a fourth pump 152d. The positions of the valves 754 shown in FIGS. 7A-7E are illustrative only—the valves 754 can assume positions other than those shown in the Figures depending upon the operational mode of the system at any given point in time.

Water (e.g., in liquid and/or vapor form) exiting the solar collector 120 can be directed to the overall steam outlet 156, or to the storage medium 770, depending upon the setting of a sixth valve 754f and a seventh valve 754g. For example, when the solar collector 120 produces relatively low quality steam (or no steam), e.g., when the solar collector 120 is starting up, shutting down, and/or is subject to low or no solar insolation (e.g., due to cloud cover), the water/steam can be directed (e.g., diverted) to the storage medium 770. This mode of operation can be entered as a function of time of day (e.g., morning or evening) and/or other parameters (e.g., insolation or steam quality). As the quality of the steam put out by the solar collector 120 increases, the output (or a greater fraction of the output) is provided to the overall steam outlet 156. Accordingly, heat received at the solar collector can be directed to the overall steam outlet 156 (and from there to an oil field or other target) during a first operational mode, and can be directed to the thermal storage medium 770 during a second operational mode.

In one mode of operation, the solar collector 120 and the heater 110 can operate together to provide steam to the overall steam outlet 156, in a manner generally similar to that described above with reference to FIG. 2D, with the sixth valve 754f opened. During nighttime operation, or other phases when the solar collector 120 produces no steam or an insufficient quantity of steam, the sixth valve 754f can be closed to isolate the solar collector 120 from the heater 110, the overall steam outlet 156, and the target 130. In at least some embodiments, the water remaining in the solar collector 120 and associated conduits can be directed through a steam storage line 771 to the storage medium 770, so as to avoid losing the heat contained in this working fluid. During a subsequent start up process, the solar collector 120 can remain isolated from the overall steam outlet 156 and the heater 110 to avoid the need for a "blow down" process (and associated "hammer" effects) that may be caused by mixing high temperature steam created by the heater 110 with water or a mixture of water and low quality steam produced during the startup of the solar collector 120. Once the quality of the steam produced by the solar collector 120 exceeds a threshold value (e.g. 80%, 90% or 95% depending upon the embodiment), the sixth valve 754*f* can be opened to allow the steam provided by the solar collector 120 to supplement and/or replace the steam provided by the heater 110.

The solar collector 120 can be linked to the heater 110 with a first connecting line 772, and the overall steam outlet can be linked to the target 130 with a second connecting line 776. During the day, the second connecting line 776 remains hot due to the steam provided by the heater 110 and/or the solar collector 120. At night, the second connecting line 776 remains hot due to the steam provided by the heater 110, but the first connecting line 772 cools, and must be re-heated when the solar collector 120 restarts the next day. Accordingly, in a particular embodiment, a first length L1 of the first connecting line 772 between the solar collector outlet 124 and the heater outlet 116 can be reduced, so as to reduce or minimize the thermal losses that may result from a long first connecting line 772 that is exposed to radiation losses during the night. For example, in at least some existing conventional arrangements, the first length L1 of the first connecting line 772 can exceed 1,000 meters, 5,000 meters, or even 10,000 meters. In particular embodiments of the presently disclosed technology, the length of the first connecting line 772 can be reduced, e.g. to a value of less than 1,000 meters and in further particular embodiments, less than 500 meters, less than 250 meters, less than 100 meters, less than 50 meters, or less than 10 meters. By co-locating the heater 110 and the solar collector 120 and reducing the first length L1, the overall system thermal losses can accordingly be reduced.

In addition to (or in lieu of) shortening the length L1 of the first connecting line 772, the system 700*a* can be configured to keep one or more portions of the first connecting line 772 hot, even when the solar collector 120 is inactive. For example, the first connecting line 772 can include an upstream portion 772*a* and a downstream portion 772*b*. By sloping the first connecting portion 772 (to provide gravity-driven condensate flow) and/or by properly adjusting the sixth, seventh, and/or other valves, the system can maintain the downstream portion 772*b* and/or the upstream portion 772*a* at a pressure and temperature that maintain the flow and/or presence of steam.

Because the second connecting line 776 is generally heated continuously, it may be less important to reduce the second length L2 of this line. In particular embodiments, the second connecting line 776 can be insulated to reduce thermal losses. In some embodiments, an additional heater 110 can be positioned along the second connecting line 776 to offset thermal losses. In any of the foregoing embodiments, the heaters 110 can be distributed so as to keep the lines hot, thus delivering increased high quality steam to the target 130.

Figure 7B:
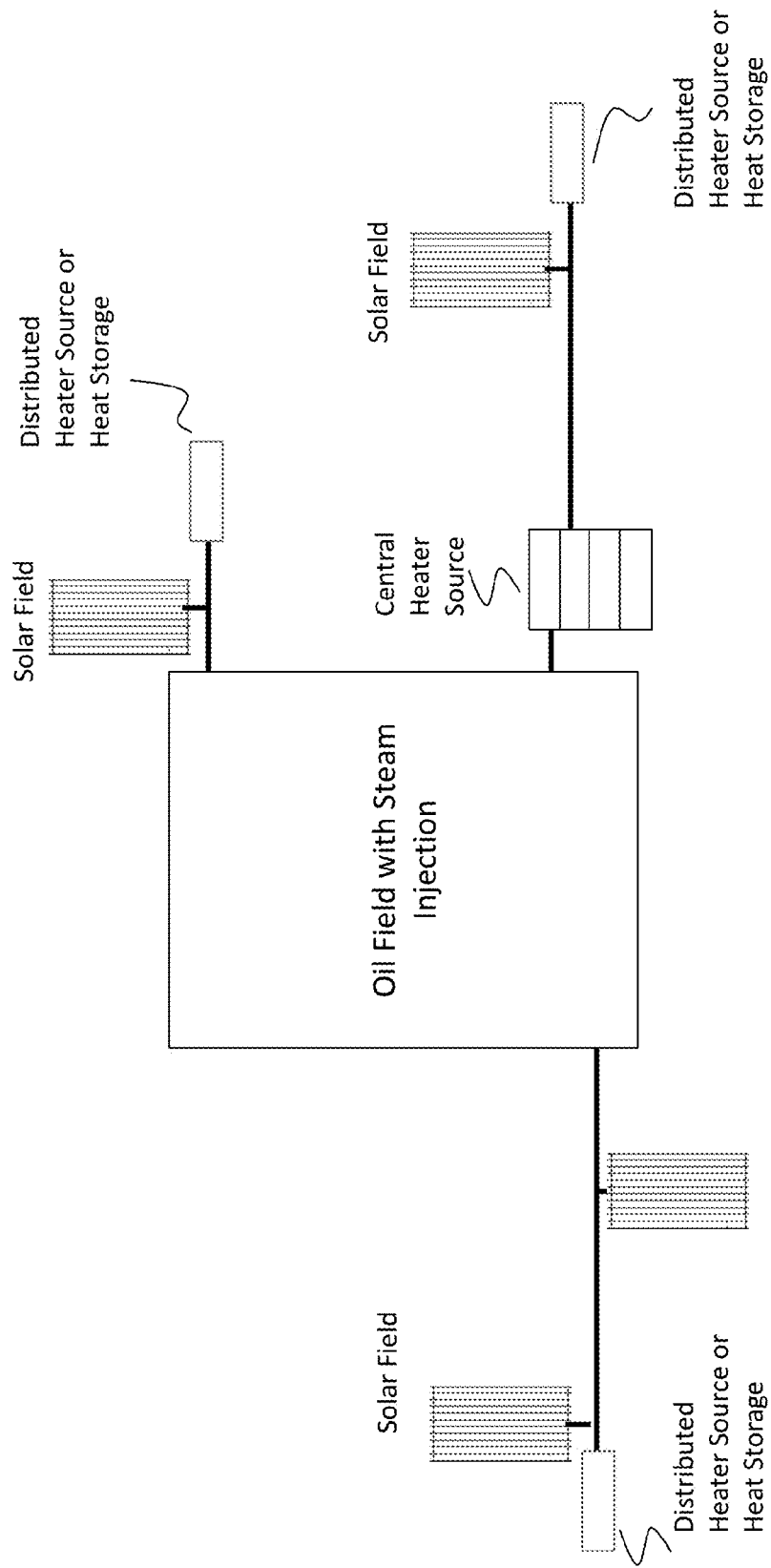
FIG. 7B is a partially schematic illustration of an oil field serviced by multiple combinations of solar collectors and heaters in accordance with an embodiment of the present technology.

FIG. 7B illustrates a particular embodiment in which an oil field is provided with steam injection, that is in turn provided from multiple sources located around the oil field. The multiple sources can include one or more solar fields (each of which can include one or more solar collectors 120) coupled in close proximity to a heater and/or heat storage medium (e.g., a heater 110 and storage medium 770, as shown in FIG. 7A). Individual solar fields can have corresponding dedicated storage media (e.g., storage tanks) and/or dedicated water supplies. In other embodiments, the storage media and/or water supplies cam be interconnected. In particular embodiments, the overall system can also include a central heater source that supplements heat provided by individual pairings of heaters and solar fields. The central heater source can also include mobile heaters that may be moved to different locations that require heat as the steam requirements of the oil field shift or change. As shown in FIG. 7B, at least some of the solar fields can be located well beyond the initial edge of the injection zone, to allow for expansion of the oil field injection operations without interfering with the solar collection process. For example, new injection wells may be added between initial injection wells and one or more of the solar fields because the solar fields are positioned far enough away from the initial injection wells to allow for additional injection wells.

Figure 7C:
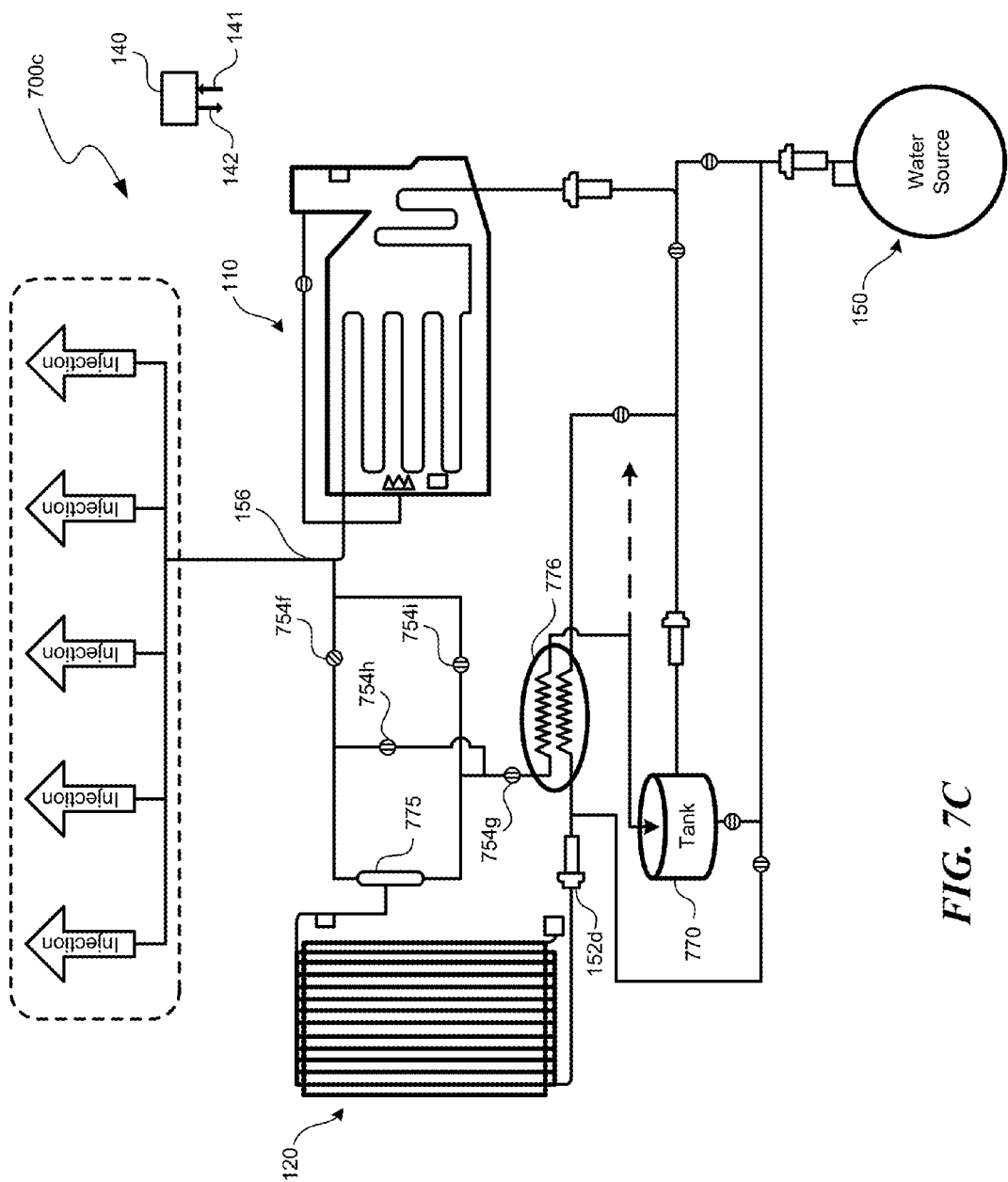
FIG. 7C is a partially schematic illustration of a system having a storage medium and separator configured in accordance with another embodiment of the present technology.

FIG. 7C illustrates another embodiment of an overall system 700*c* that includes several features similar to those described above with reference to FIG. 7A. In addition, the system 700*c* can include a separator 775 that separates higher quality steam from lower quality steam and/or water. Accordingly, steam or a liquid/steam mixture exiting the solar collector 120 enters the separator 775, with steam directed to the sixth valve 754*f* and the overall steam outlet 156. Water is directed from the separator 775 to the seventh valve 754*g* for delivery to the storage medium 770. In addition, the separator 775 itself can serve as a storage medium and can accordingly be insulated and/or otherwise configured to reduce thermal losses. In a particular embodiment, the system 700*c* can include a heat exchanger 776 (e.g., a counterflow heat exchanger) that transfers heat from the water separated at the separator 775 to water entering the solar collector 120. In the illustrated embodiment, the heat exchanger 776 is positioned upstream of the fourth pump 152*d*. In other embodiments, the heat exchanger 776 can be positioned downstream of the fourth pump 152*d*. In any of these embodiments, the water removed from the separator 775 and directed through the heat exchanger 776 can then be directed to the storage medium 770, as discussed above. In still further embodiments, for example, when the water includes an unacceptably high level of sediment, minerals, and/or other particulates, the water removed from the separator 775 can instead be directed to a filtration system, or simply dumped, as indicated in dashed lines in FIG. 7C.

The system 700*c* can also include an eighth valve 754*h* and a ninth valve 754*i*. The eighth valve 754*h* can optionally direct steam to the storage medium 770. The ninth valve 754*i* can be used to selectively add water back to the flow of steam produced at the separator 775 to control the quality of the steam.

Figure 7D:
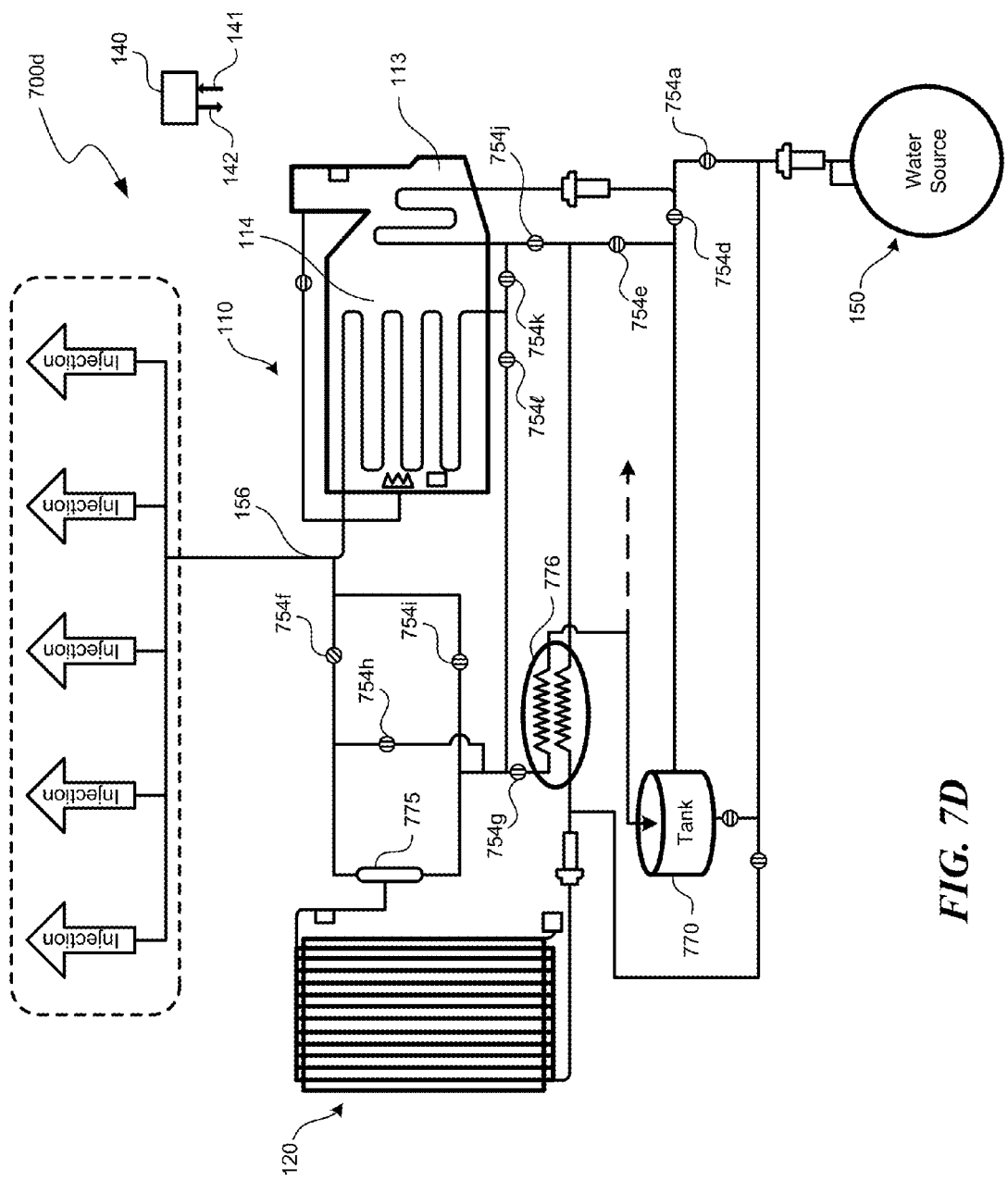
FIG. 7D is a partially schematic illustration of a system having a valving arrangement configured in accordance with still another embodiment of the present technology.

FIG. 7D illustrates a system 700*d* configured in accordance with still another embodiment of the present disclosure. In this embodiment, the system 700*d* includes a separator 775 and a storage medium 770, as discussed above with reference to FIG. 7C. In addition, the system 700*d* can include a valving arrangement, generally similar to that described above with reference to FIGS. 2A-2D, which allows water to be selectively directed the first heater portion 113 and/or the second heater portion 114 of the heater 110. Accordingly, the system 700*d* can include a tenth valve 754*j*, an eleventh valve 754*k*, and a twelfth valve 754*l*. Each of these valves can be adjusted to direct water through only the first heater portion 113 (e.g., by opening the tenth valve 754*j* and closing the eleventh valve 754*k* and the twelfth valve 754*l*) or through both the first heater portion 113 and the second heater portion 114. For example, with the tenth valve 754*j* open and the eleventh valve 754*k* closed, water is pre-heated at the first heater portion 113 before entering the solar collector 120. By opening the twelfth valve 754*l*, water collected at the separator 775 can be directed to the second heater portion 114 so as to be converted to steam. Accordingly, the twelfth valve 754*l* can be operated to direct water removed from the separator 775 into the heater 110, rather than to the storage medium 770. In this mode of operation, the seventh valve 754*g* is closed at the same time the twelfth valve 754*l* is opened.

Figure 7E:
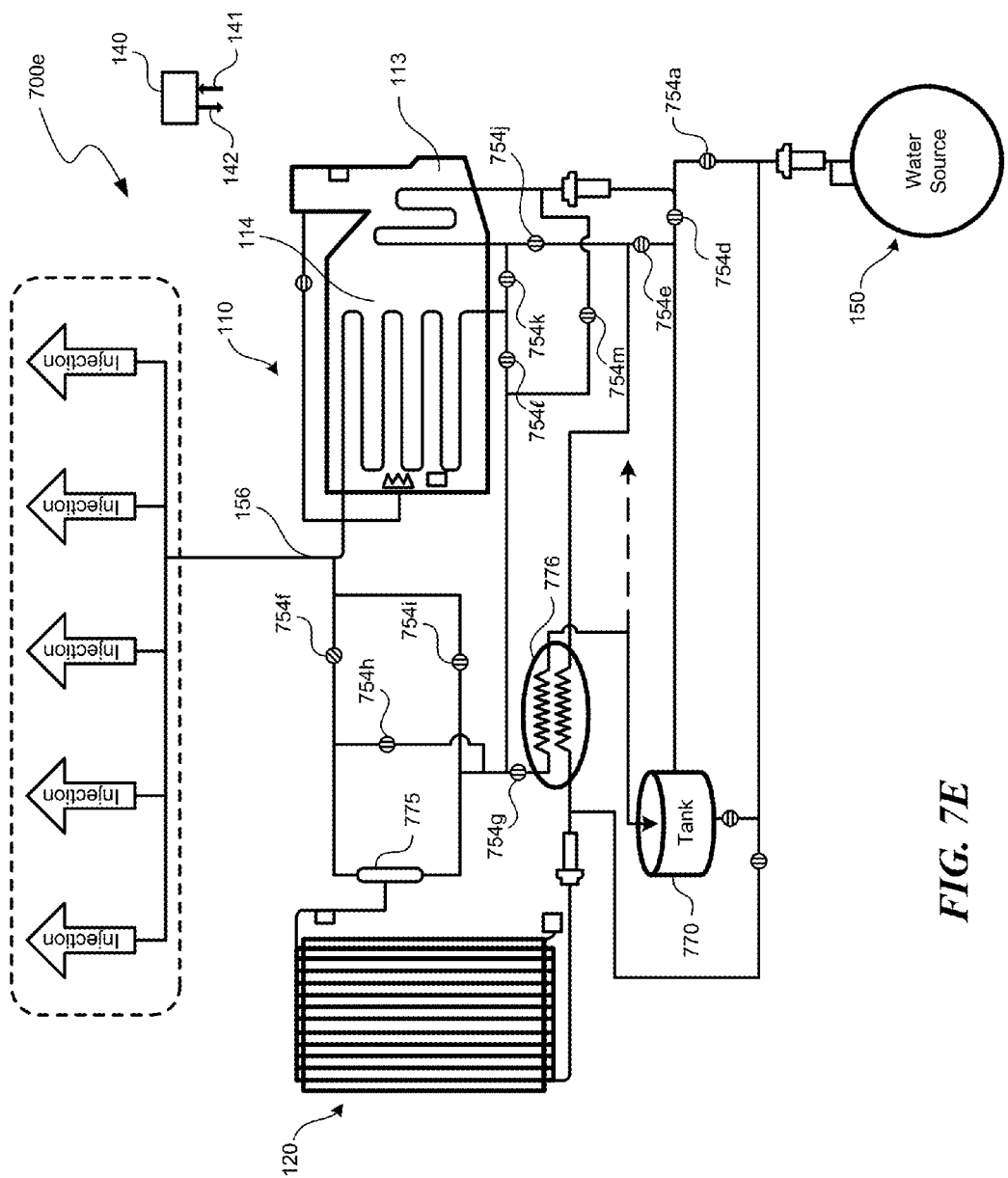
FIG. 7E is a partially schematic illustration of a system having a valving arrangement in accordance with yet another embodiment of the present technology.

FIG. 7E illustrates a system 700*e* configured in accordance with yet another embodiment of the present technology. In this embodiment, the system 700*e* includes features generally similar to those discussed above with reference to FIG. 7D, and, in addition, include a thirteenth valve 754*m*. The thirteenth valve 754*m*, in combination with the twelfth valve 754*l*, allow water removed from the separator 775 to be directed to either the first heater portion 113 or the second heater portion 114. The settings of these valves can be determined by the controller 140, and the process for opening and/or closing these and/or any other valves of the system can be based upon the relative temperatures and pressures of the water in the system, the extent to which the water requires further heat, the demands of the target 130 and/or other factors. For example, if the water exiting the separator 775 is at a temperature below that of the first heater portion 113, it can be directed to the first heater portion 113 before being directed to the second heater portion 114. If the water exiting the separator 775 has a temperature above that of the first heater portion 113 and below that of the second heater portion 114, it can be directed to the second heater portion 114, bypassing the first heater portion 113.

Embodiments of the systems described above with reference to FIGS. 7A-7E include features that can provide one or more of several advantages over conventional systems. For example, at least some of the embodiments of the foregoing systems include a storage medium. The storage medium can recover heat that is present in the solar collector 120 after shutdown and/or during periods of low output, and can accordingly eliminate or at least reduce the losses associated with simply allowing this heat to exit the system via radiation, convection, and/or conduction.

Another feature of at least some of the foregoing embodiments is that the heater 110 can be operated to provide a continuous flow of steam overnight. In some embodiments, the amount of steam produced by the heater at night is sufficient to meet the requirements of the target 130, e.g., to maintain an oil field injection process at full capacity. In other embodiments, the heater 110 can operate at night simply to maintain a threshold flow of steam through the system. This arrangement can eliminate the thermal cycling that would otherwise be experienced by these portions of the system, and can eliminate water accumulation in the lines to which it is connected. This in turn can reduce operating risks and startup delays, and can reduce maintenance costs. When used in this latter mode (e.g., to provide a threshold level of steam that may be below typical operational requirements), the heater can be appropriately sized to meet this functional requirement. In particular, the heater can be smaller than a heater sized to produce the full steam output required by the target 130, and/or can be configured to operate efficiently at low output levels when simply maintaining the threshold level of steam rather than a fully operational level of steam.

Another feature of at least some of the foregoing embodiments includes maintaining steam in a greater fraction of the lines associated with steam production, despite the cyclic nature of the solar collector. This approach can reduce the likelihood for line blow down. For example, as discussed above, the conduits associated with the solar generator can be isolated from the rest of the system during startup to reduce or eliminate contact between water and high quality steam, until the solar generator produces steam at a high enough quality to be reconnected with the rest of the system. This arrangement can reduce the waste steam associated with line blow down, reduce lost steam production periods associated with line blow down, and/or reduce the maintenance costs associated with thermal cycling of the lines. Such maintenance costs may include repairing or replacing lines that become damaged as a result of cyclic, thermally-induced expansion and contraction.

Still another feature of at least some of the foregoing embodiments is that a heater can be co-located with a corresponding solar collector to reduce the length of the connecting line between the solar collector and the overall steam outlet. As discussed above, this arrangement can reduce blow down, thermal losses, and/or the maintenance costs. In particular embodiments, a single heater may be coupled to a single solar collector. In other embodiments, a single heater may serve multiple solar collectors (e.g., arranged circumferentially around a common heater). In still further embodiments, multiple heaters can service a single solar collector.

Figure 8A:
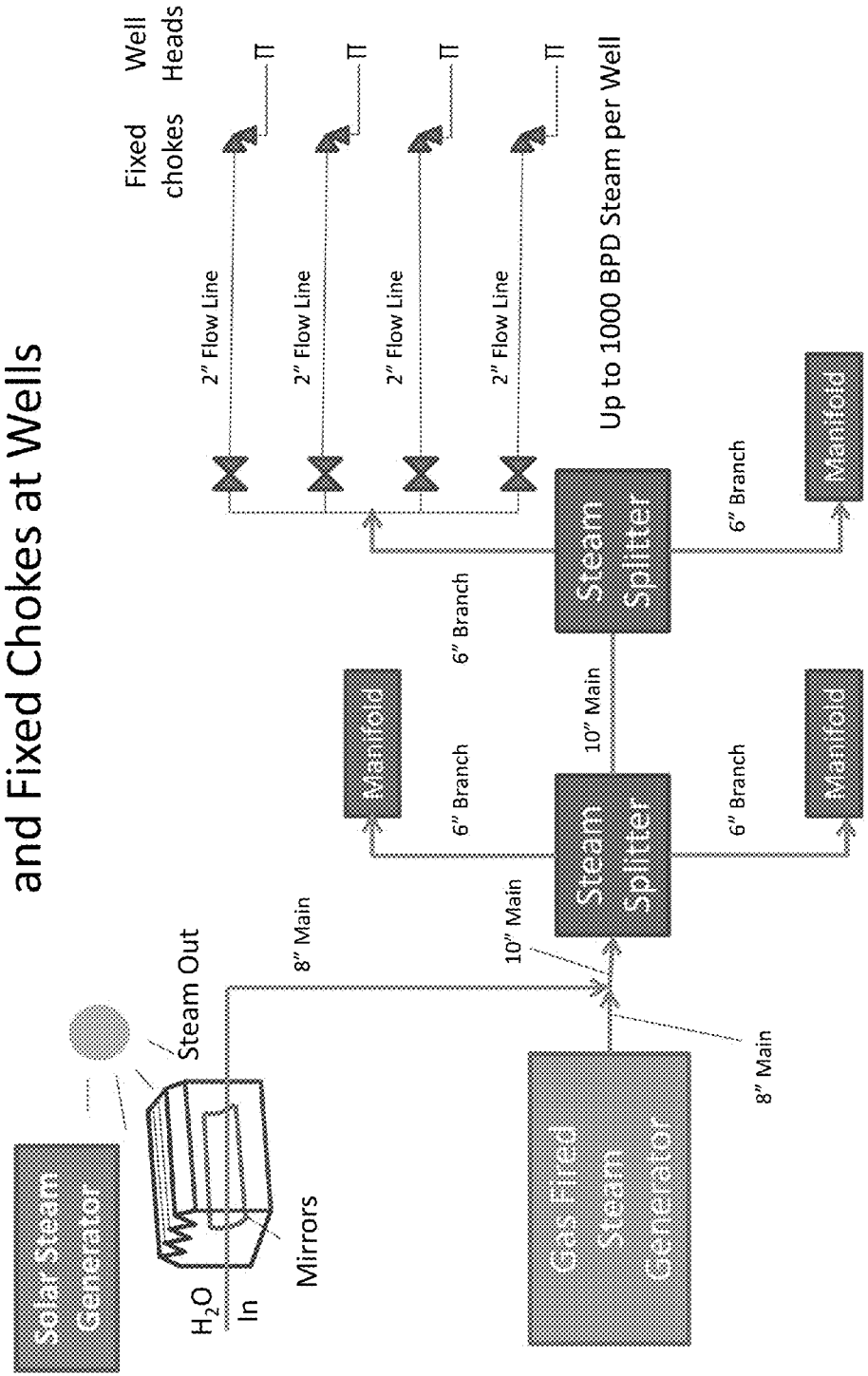
FIGS. 8A-8C are partially schematic illustrations of systems having piping and valve configurations in accordance with still further embodiments of the present technology.
Figure 8B:
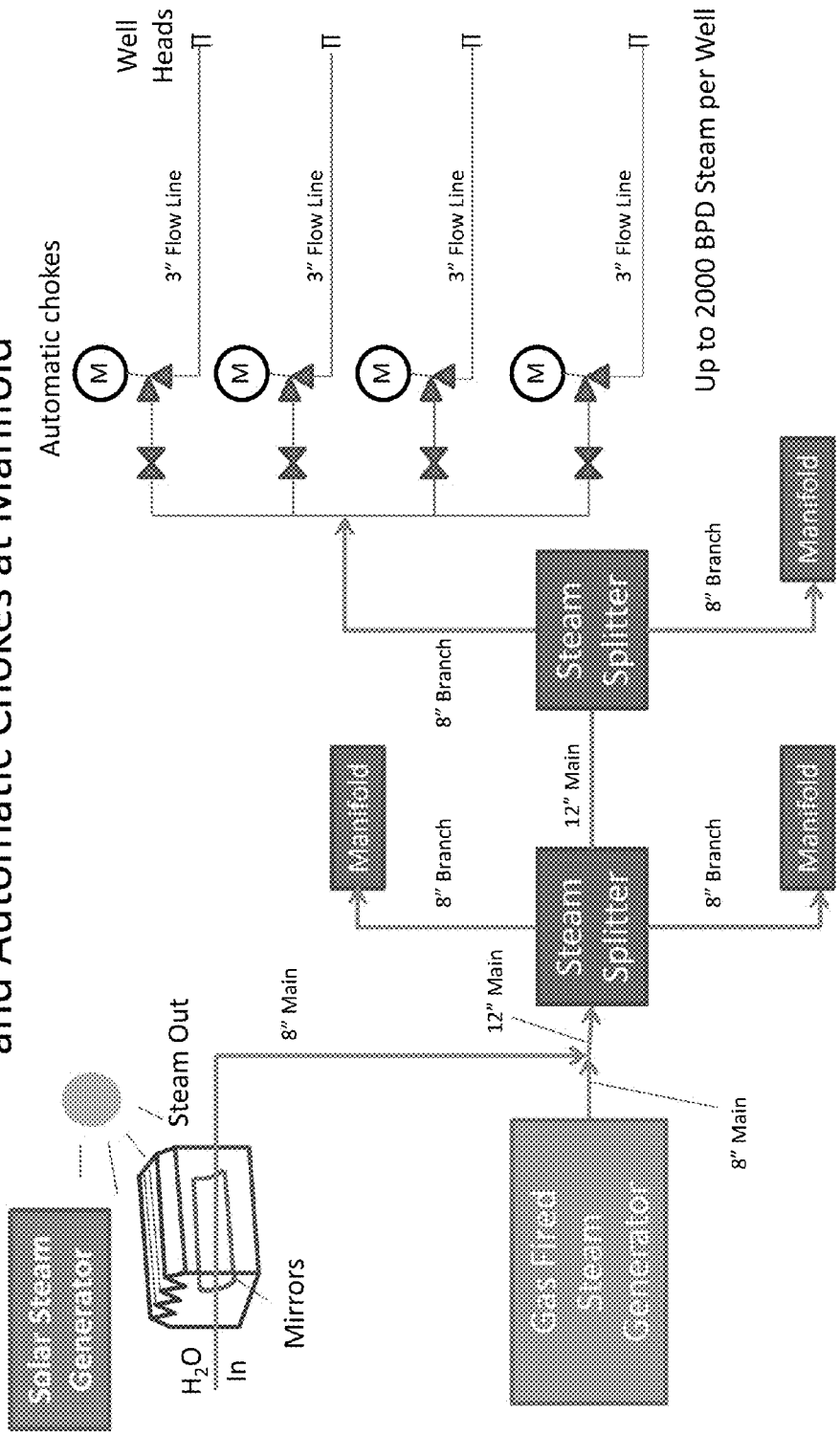
Figure 8C:
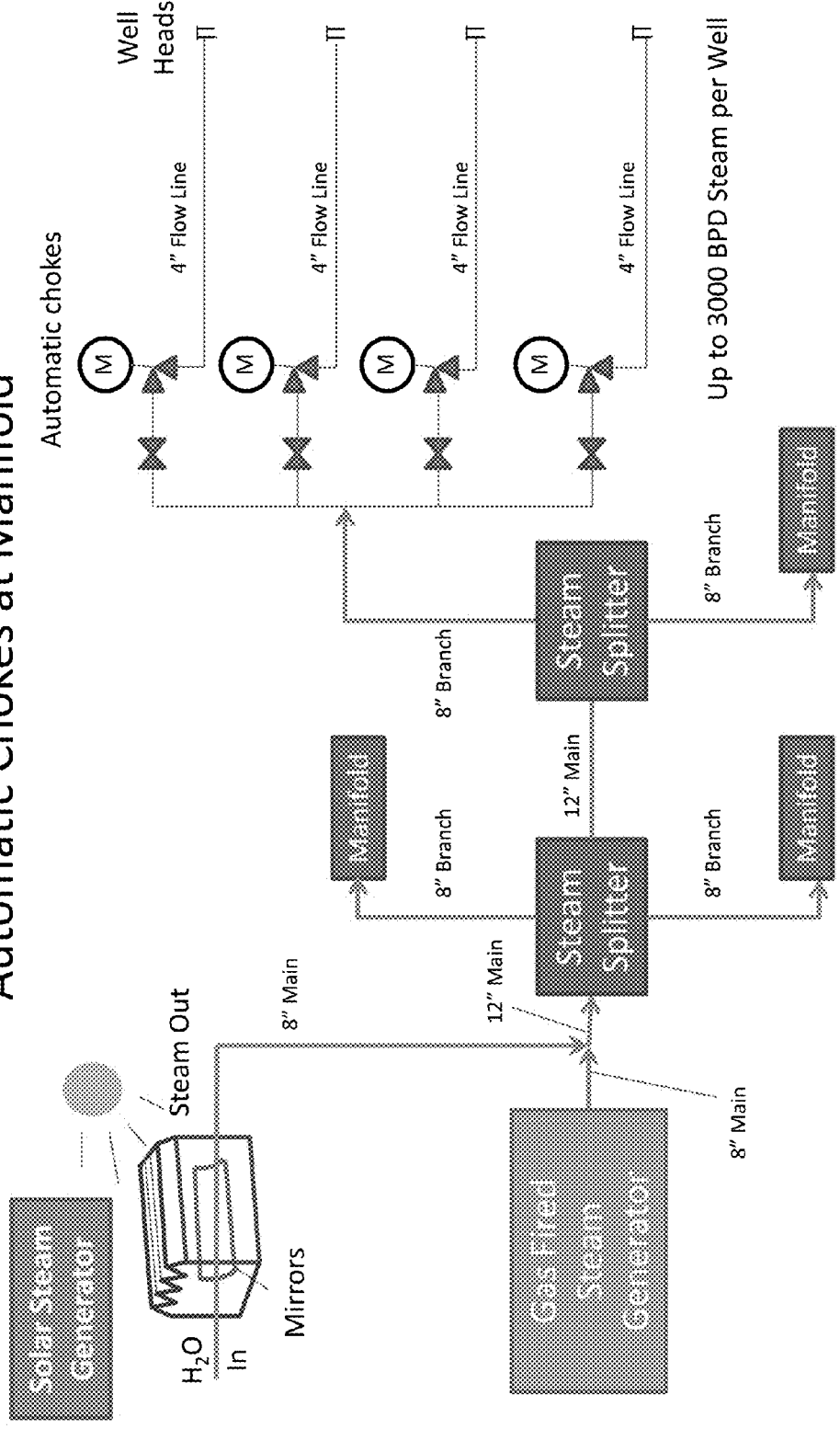

FIGS. 8A-8C illustrate still further aspects of the disclosed technology. FIG. 8A illustrates an injection system that uses a 2" flow line and fixed chokes at the well heads to control steam flow. The fixed chokes rely on choked (sonic) flow to limit the flow through each pipe and provide a uniform flow over many pipes. Injection rates to the wells can vary with steam generator pressure, with injection rates typically limited to about 1000 bbl/day. FIG. 8B illustrates a system with automated (adjustable) chokes, and with the chokes moved from the wells to the upstream manifolds. The flow lines are increased from 2" to 3" in diameter, producing injection rates up to about 2000 bbl/day. FIG. 8C, which will be discussed in greater detail later, illustrates oversized flow lines configured to enhance the use of solar generated steam.

Typical oil field steam injection techniques include "cyclic stimulation" or "huff-and-puff" injection, in which steam is injected into all oil wells for some period of time. Each well is optionally left for an additional period of time to "soak", and then oil and water are produced back from the well, until production falls to a predetermined rate, or a predetermined period of time has passed. The cycle—inject, soak, produce—is then repeated.

Another common approach involves continuous injection of steam in one set of wells ("injectors"), and continuous production in adjacent wells ("producers"). Based on the spatial relationship of injectors and producers such projects are known as steam floods, steam drives, SAGD (steam assisted gravity drainage), and by other names as well.

It is common in a particular oilfield to begin the overall steam injection project with a period of cyclic injection in all wells, so as to produce early oil and also so as to warm the formation, improving the permeability and communication between injectors and producers. Then it is common to begin steamflood continuous or semi-continuous injection in the injection wells for an extended period of time. During the early period of the project, continuing injection of steam raises the temperature of the formation surrounding the injection well. The higher temperatures and the flow within the formation away from the injector well of fluids, including oil, increases the "injectivity" of the well—that is, increases the rate of steam flow into the injector well for a given wellhead steam pressure. As injectivity rises, in many steamflood operations, to maintain a roughly constant daily mass of steam per injector, the surface steam pressure may be reduced.

A typical steamflood has a limited number of steam sources, e.g. one or a plurality of boilers—and a much larger number of injection wells. An important element to the success of any steamflood is the proper distribution of steam flow into the injection wells. Without proper design for the distribution of steam, more steam might flow into those injection wells which are located closer to the boilers (with correspondingly lower flow-related hydraulic pressure drop), and less steam would flow into wells which are relatively farther from the boilers. Such imbalance of steam distribution is undesirable, as it would provide imbalance of formation heating and reduce both the rate of production and the total recovery of oil. Accordingly, flow control devices installed at each wellhead, or installed at each group of wells, are an important part of a steamflood operation. As noted above with reference to FIGS. 8A and 8B, fixed chokes are used in some contexts (steamflood) and automated adjustable chokes in others (cyclic).

As steam injection proceeds over months and years, the formation eventually heats and reaches an equilibrium or plateau condition, where a steam space and heated region has been established. The rate of steam injection required to maintain this heated zone is typically lower than the rate of steam injection which was required to heat the formation originally and overcome thermal losses. As a result, the total amount of steam per injector per day into a given injector well typically is reduced after this equilibrium condition has been achieved.

The operating characteristics of solar steam generators, whose output varies widely from zero flow overnight to peak flow at noon, are quite different from the operating characteristics of fuel-fired steam generators, which typically are operated at a roughly constant rate of steam production for extended periods (weeks or months of continuous constant-output operation). The interconnection of solar steam generators poses particular issues for the design of oilfield steam distribution networks and steam injection wells, particularly as the desired fraction of solar steam increases.

As discussed above, the output of a solar steam generator (e.g., a solar collector) and a fuel-fired steam generator (e.g., a heater) can be balanced—as solar steam output increases, the firing rate and steam generation rate of fuel-fired steam generation is decreased, so as to provide an approximately constant total rate of steam production per hour. In such a roughly constant-rate steam production, the total fraction of annual steam which can be provided by solar is limited by the fraction of annual hours when suitable solar radiation is available. Typical figures are in the range of 20% to 30% of total annual steam.

It is of significant value to oilfield operators to derive a greater fraction of their total annual steam from solar energy, without reducing the rate of oil production from the field. This is accomplished in accordance with embodiments of the presently disclosed technology by injecting more steam during the day, and less at night. In particular embodiments, this includes allowing the peak steam flow rate to rise above the daily average rate, and allowing the overnight rate of steam injection to drop below the daily average rate.

This matter of daily rate variation of steam injection poses challenges for both the design of the injection wells and the design of the steam distribution network. The present disclosure addresses both topics.

Solar Fraction Versus Life of Field

Typically in a steamflood operation, the rate of steam injection per well is established by the steam flow needed during the earliest period of the steamflood—that is, the time when the formation is coldest, has the lowest injectivity (lowest flow versus pressure), and requires the greatest amount of steam to achieve formation warming. A field is designed with a chosen number of injection wells, designed to handle a particular steam pressure and flow, so as to economically improve (e.g., optimize) the cost of steam injection versus the oil production response. More injection wells on closer spacing, or higher steam pressures and well bores, can of course result in higher rates of steam injection; but such changes also result in higher cost. Those skilled in the art commonly optimize the cost of facilities against the projected value of the oil production expected from such facilities design, so as to arrive at a balanced design which trades cost against expected revenue.

If high-fraction solar steam were desired at the outset of the steamflood, the high rate variation associated with solar steam production would face limited injectivity and high demand for steam per well. Delivering a large amount of steam per hour against high injection pressures would increase the cost of each injection well (larger bore, higher pressure) and/or the cost of the steam distribution network (higher peak pressure) and/or the number of injection wells (higher cost due to more injectors).

Accordingly, aspects of the present technology address this issue. In particular embodiments, solar steam is integrated into the oilfield at an increasing fraction as the steamflood progresses. The starting configuration of the steamflood design is optimized as it would be for constant-rate steam injection. Fuel-fired steam generators are turned down daily to roughly match the output of solar steam generators, so that total steam production is roughly constant. As the formation heats and injectivity rises, more solar steam generators are added to the oilfield, or fuel-fired steam generators are removed and/or operated less. Without increasing the peak pressure in the steam distribution network, the rising injectivity allows a higher peak steam flow and thus allows solar energy to provide a higher fraction of daily total required steam. Put another way, higher injectivity allows greater flow rates at the same or lower pressures. Solar energy can produce the same daily flow rate as a fuel fired steam generator, but with a high flow rate during the day, and a low or zero flow rate at night. Accordingly, as the peak flow rate capacity of the system increases with increased injectivity, solar energy can provide a greater and greater fraction of the total required steam—it does so by producing more steam during the day and less (or none) at night, and accordingly is suitable in cases where the total flow per day is more important than a consistent flow throughout the day.

As the requirement for mass of steam per well per day drops over months and years of steam injection, the solar steam fraction is increased further, by installing more solar steam generation capacity and/or removing or reducing the operation of fuel-fired steam generators. Thus an installation which might in its first year deliver only 20% solar steam, by its fifth year of operation might be running 80% annual solar steam fraction, without an increase of the number of wells, or an increase in the pressure rating of the steam distribution network. On a lifetime basis, then, this innovation optimizes (or at least improves) the total fuel saving (a key goal of solar steam generation) at a low total capital cost in the steam distribution and injection network.

Variable-Rate Steam Distribution

Typical practice in the oilfield to accomplish the proper distribution of steam across multiple injection wells is the use of "chokes", devices which incorporate nonlinear pressure-drop phenomena at a chosen flow rate or pressure. Flowrate-limiting "fixed chokes" (FIG. 8A) deliver a roughly constant flow rate into a well, limiting the flow rate by flow phenomena associated with the speed of sound. Using fixed chokes allows a steam injector close to the boiler, at a relatively higher wellhead steam pressure, to deliver the same mass of steam per day down the well as another similarly equipped injector at a relatively lower wellhead steam pressure located farther from the boilers.

Such fixed chokes, however, are effective only for a limited range of operating pressures, and do not allow for the proper distribution of steam at varying flow rates. As an oilfield changes how it is operated, from total fixed-rate steam, and low solar steam fraction, to highly varying steam flow rate, and high solar fraction, fundamentally new mechanisms must be employed to assure proper distribution of steam across multiple injection wells from a common source.

Motor-operated valves and/or motor-operated chokes (FIG. 8B) are in common use for cyclic steam injection operations in the oilfield. Such motor-operated valves allow steam to be delivered from a common distribution header into each well on a proper schedule as described above.

The present technology employs motor-operated valves to accomplish the proper distribution of steam injection across multiple wells at varying flowrates. In particular embodiments, a controller is associated with each valve, and a sensor is associated with each injector. A control mechanism determines the appropriate rate of steam injection for a given well, senses the current flow rate of steam into the well, and adjusts a motor-operated valve or motor-operated choke so as to bring the rate to the desired rate. The desired rate of steam injection into each well may be calculated locally by a controller based on a fixed schedule (hour of the day), based on a signal transmitted from a central controller, or based on measurements of characteristics of the steam distribution network. In some embodiments all steam injection rates are commanded from a central controller based on the current availability of solar steam and fuel-fired steam, and information may be broadcast to wellhead controllers. In other embodiments, a communications path may exist from a central controller to each wellhead controller and allow finer adjustment of flowrate per well. In other embodiments, local wellhead controllers may sense characteristics of the steam distribution network—e.g. variations in pressure—and may cause the controller to move to a defined higher flowrate, than the flowrate at a relatively lower pressure in the steam distribution network. Each wellhead controller may sense the mass flow of steam into its associated well by one of several means, including coriolis-type mass flow meters, sensors which measure the relative pressure on each side of an orifice plate, sensors which employ rotating elements such as turbines to sense flow velocity, or sensors which employ other characteristics such as magnetic flow meters, to sense the mass flow currently entering each injection well.

FIG. 8C illustrates a system design which anticipates and exploits the change in field injectivity using selective pipe sizing and automated chokes, in accordance with an embodiment of the present technology. In one aspect of this embodiment, the flow lines are oversized compared to the initial steam flow rate through the system. In other words, the initial low injectivity of the rock formation, rather than the pipe size, limits the flow rate. As the injectivity increases, the larger pipes can accordingly handle an increased flow rate. As discussed above, such an increased flow rate can allow solar generators to produce a sufficient daily flow rate of steam by delivering a large quantity of steam during daylight hours and no or low quantities of steam at night. The automated valves can be used to individually control the flow rate to individual wells so as to improve the uniformity of the steam delivery process, even in a steamflood (as opposed to cyclic) operation. The automated valves can also be employed to support any of a variety of other suitable variations.

From the foregoing, it will be appreciated that specific embodiments of the present technology have been described herein for purposes of illustration, but that various modifications may be made without deviating from the present technology. For example, while the heater 120 is shown as including a single burner 111, in other embodiments, the heater 110 can include multiple burners. For example, a multi-burner configuration can include a larger burner and a smaller burner so as to accommodate deeper turndown. A potentially significant feature of a multi-burner configuration is the ability to maintain of a particular profile of $NO_x$ generation during turndown operation. The first and second heater portions 113, 114 are illustrated as single pass, folded tubes. In other embodiments, either or both of these heater portions can include any of a variety of parallel, serial, and/or other suitable heat exchanger arrangements. For example, the first portion 113 and/or the second portion 114 can, in at least some embodiments, have two or more parallel sections, each of which can separately deliver heated water to the solar collector 120. This arrangement can reduce the overall pressure drop of water passing through the heater 110 and will typically include appropriate valving and/or other management features to properly balance the flows. In still further embodiments, the heater 110 can include more than two individually controllable portions. In any of these embodiments, the heat exchange surfaces of the heater portions are appropriately sized to enhance efficiency at low cost. The heater 110 can be a direct-fired boiler, a heat recovery steam generator (e.g., capturing waste from a fuel-fired turbine, and/or a heat recovery steam generator with auxiliary fuel firing (e.g., a "duct burner" or "supplemental firing" arrangement). Aspects of the technology disclosed herein can be applied to "once through" steam generators, and/or to recirculating steam generators, depending on the embodiment. Other arrangements for heaters, solar collectors, and associated components are disclosed in the following published PCT applications, assigned to the assignee of the present application, and incorporated herein by reference: WO2010/088632; WO2012/006255; WO2012/006257; WO2012/006258; and WO2012/128877.

Certain features have not been shown or described in detail herein for purposes of clarity. Such features include but are not limited to additional isolation valves at the solar collector 120 (to allow the solar collector to be drained for maintenance), and/or other suitable maintenance and non-maintenance features.

Certain aspect of the technology described in the context of the particular embodiments may be combined or eliminated in other embodiments. For example, particular embodiments can operate in fewer than all of the modes described above, and/or can include different valve arrangements. The exhaust gas recirculation feature can be eliminated in some embodiments. Features discussed in the context of any of the Figures (e.g., FIGS. 7A-7E) may be combined in a suitable manner with features disclosed in other Figures (e.g., FIGS. 2A-2E). Particular aspects of the technology are embodied in steam production systems and associated methods for producing steam. Other embodiments include methods of making, configuring, adjusting and/or changing such systems, as well as methods for instructing these techniques. Further, while advantages associated with certain embodiments of the technology have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly shown or described herein.

We claim:

1. A solar energy system, comprising:
   a water flow system, including a water source and a network of conduits coupled to an underground well;
   a solar collector coupled to the water source to heat water;
   a heat recovery steam generator having an evaporator and being coupled to:
   (a) a combustion source to receive heat,
   (b) the water source to receive water, and
   (c) the solar collector to receive at least one of water and steam;
   an attemperator coupled to the network to direct water into a flow of steam and regulate a temperature of the steam; and
   a controller having a computer-readable medium programmed with instructions that, upon execution:
   direct water from the attemperator to the flow of steam to regulate a temperature of the flow of steam.

2. The solar energy system of claim 1 wherein the network of conduits is coupled to a target, and wherein the target includes a thermoelectric power generator.

3. The solar energy system of claim 1 wherein the attemperator is positioned between the heat recovery steam generator and a target.

4. The solar energy system of claim 3 wherein the target includes a thermoelectric power generator.

5. The solar energy system of claim 1 wherein the heat recovery steam generator includes an economizer and a superheat portion, and wherein the computer-readable medium is programmed with instructions that, when executed:
   direct water from the water source to the economizer, from the economizer to the solar collector, and from the solar collector to the superheat portion.

6. The solar energy system of claim 1 wherein the combustion source includes a combustion turbine having a hot gas exhaust coupled to the evaporator.

7. The solar energy system of claim 1, further comprising a supplemental heater coupled to the heat recovery steam generator.

8. The solar energy system of claim 1 wherein the computer-readable medium is programmed with instructions that, when executed:
   selectively direct water to the solar collector, the heat recovery steam generator, or both.

9. The solar energy system of claim 1, further comprising a steam drum coupled to the evaporator to separate steam from liquid water.

10. The solar energy system of claim 9 wherein the computer-readable medium is programmed with instructions that, when executed:
    selectively directs water from the economizer, around the evaporator and to the solar collector, the steam drum, or both.

* * * * *